United States Patent
Watanabe et al.

(10) Patent No.: US 6,771,202 B2
(45) Date of Patent: Aug. 3, 2004

(54) ANALOG-TO-DIGITAL CONVERSION METHOD AND DEVICE

(75) Inventors: Takamoto Watanabe, Nagoya (JP); Mitsuo Nakamura, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/421,234

(22) Filed: Apr. 21, 2003

(65) Prior Publication Data

US 2003/0201927 A1 Oct. 30, 2003

(30) Foreign Application Priority Data

Apr. 24, 2002 (JP) ........................................ 2002-122342
Dec. 25, 2002 (JP) ........................................ 2002-374856

(51) Int. Cl.[7] ................................................ H03M 1/12
(52) U.S. Cl. ........................................ 341/155; 341/118
(58) Field of Search ................................ 341/155, 126, 341/141, 110, 116, 122, 129, 156, 143

(56) References Cited

U.S. PATENT DOCUMENTS

| 5,396,247 A | 3/1995 | Watanabe et al. ............ 341/157 |
| 5,416,444 A | 5/1995 | Yamauchi et al. ............. 331/45 |
| 5,818,797 A | 10/1998 | Watanabe et al. ............ 368/113 |
| 6,411,241 B1 * | 6/2002 | Taketoshi ..................... 341/155 |
| 6,476,749 B1 * | 11/2002 | Yeap et al. ................... 341/155 |

FOREIGN PATENT DOCUMENTS

| JP | 5-259907 | 10/1993 |
| JP | 6-216721 | 8/1994 |
| JP | 9-218281 | 8/1997 |
| JP | 10-54887 | 2/1998 |

* cited by examiner

Primary Examiner—Brian Young
Assistant Examiner—Joseph Lauture
(74) Attorney, Agent, or Firm—Harness, Dickey & Pierce, PLC

(57) ABSTRACT

In a device for analog-to-digital converting an input signal, the input signal is applied to a plurality of delay units constituting a pulse delay circuit in order to change a delay time to be given by the delay units. The number of delay units through which a pulse signal has passed during one period of sampling clocks is numerically expressed. The A/D conversion device has a plurality of pulse position numerizing units that is used for A/D conversion. Sampling clocks of which the phases are different from one another are applied to the respective pulse position numerizing units. An adder summates numerical data items produced by the respective pulse position numerizing units so as to generate final numerical data representing a result of A/D conversion.

43 Claims, 21 Drawing Sheets

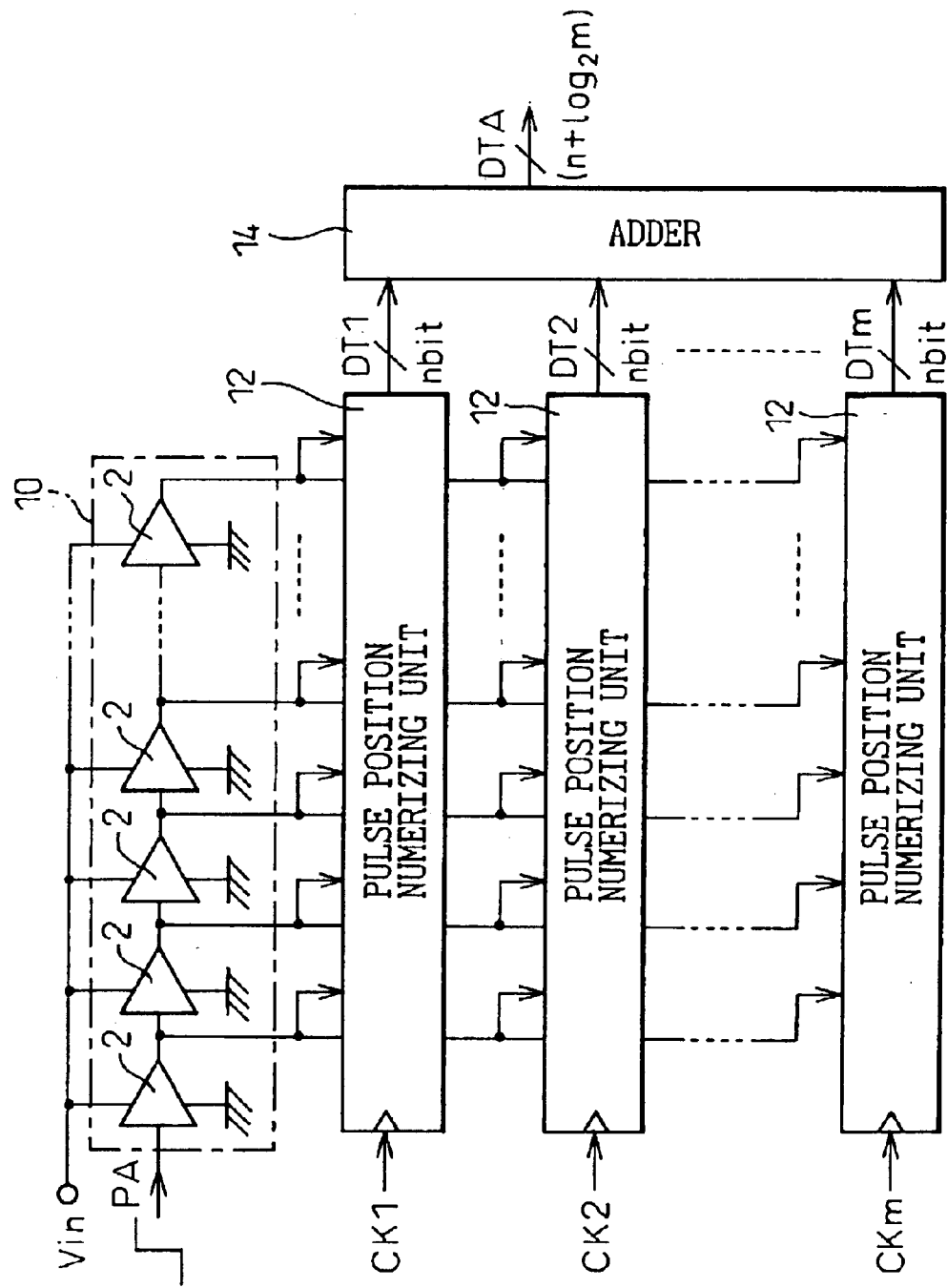

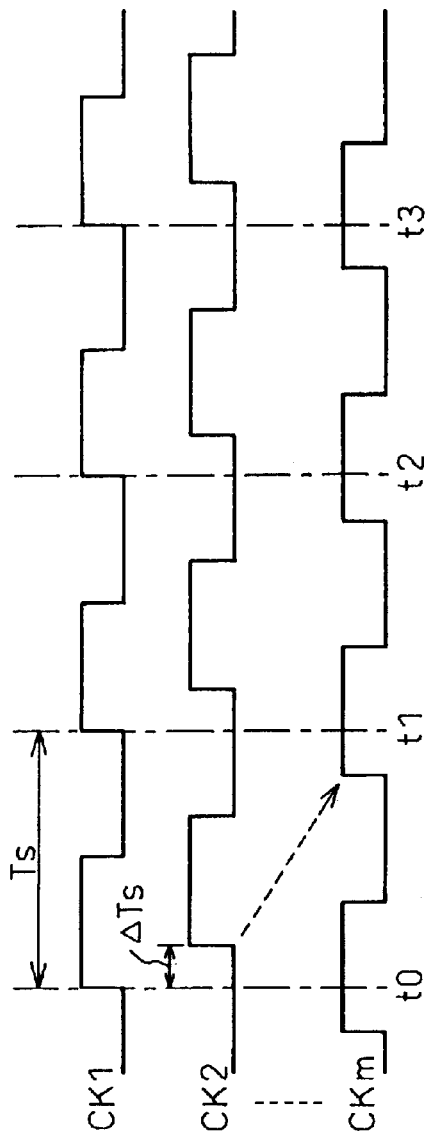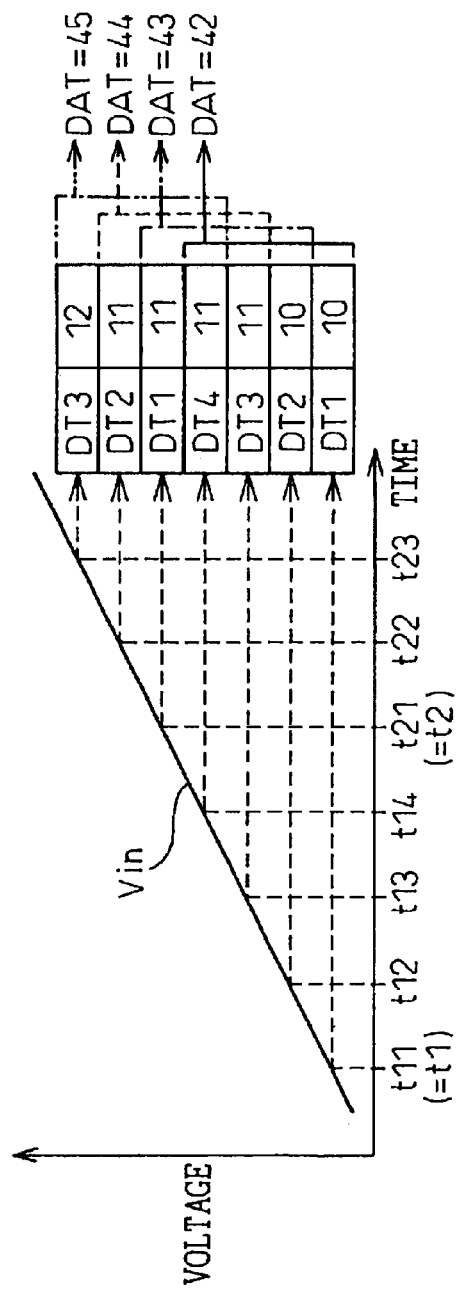

TO EACH PULSE POSITION NUMERIZING UNIT 12

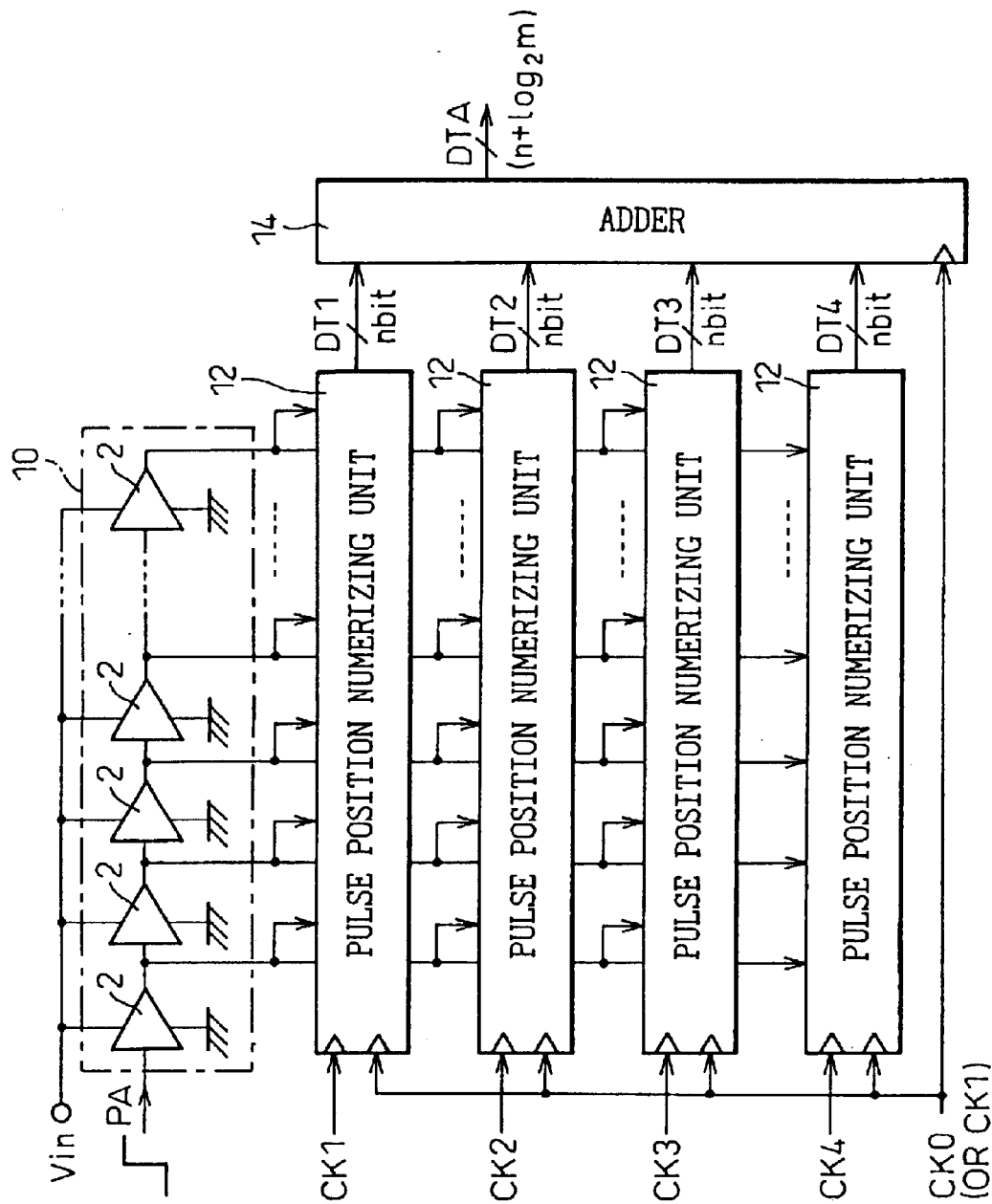

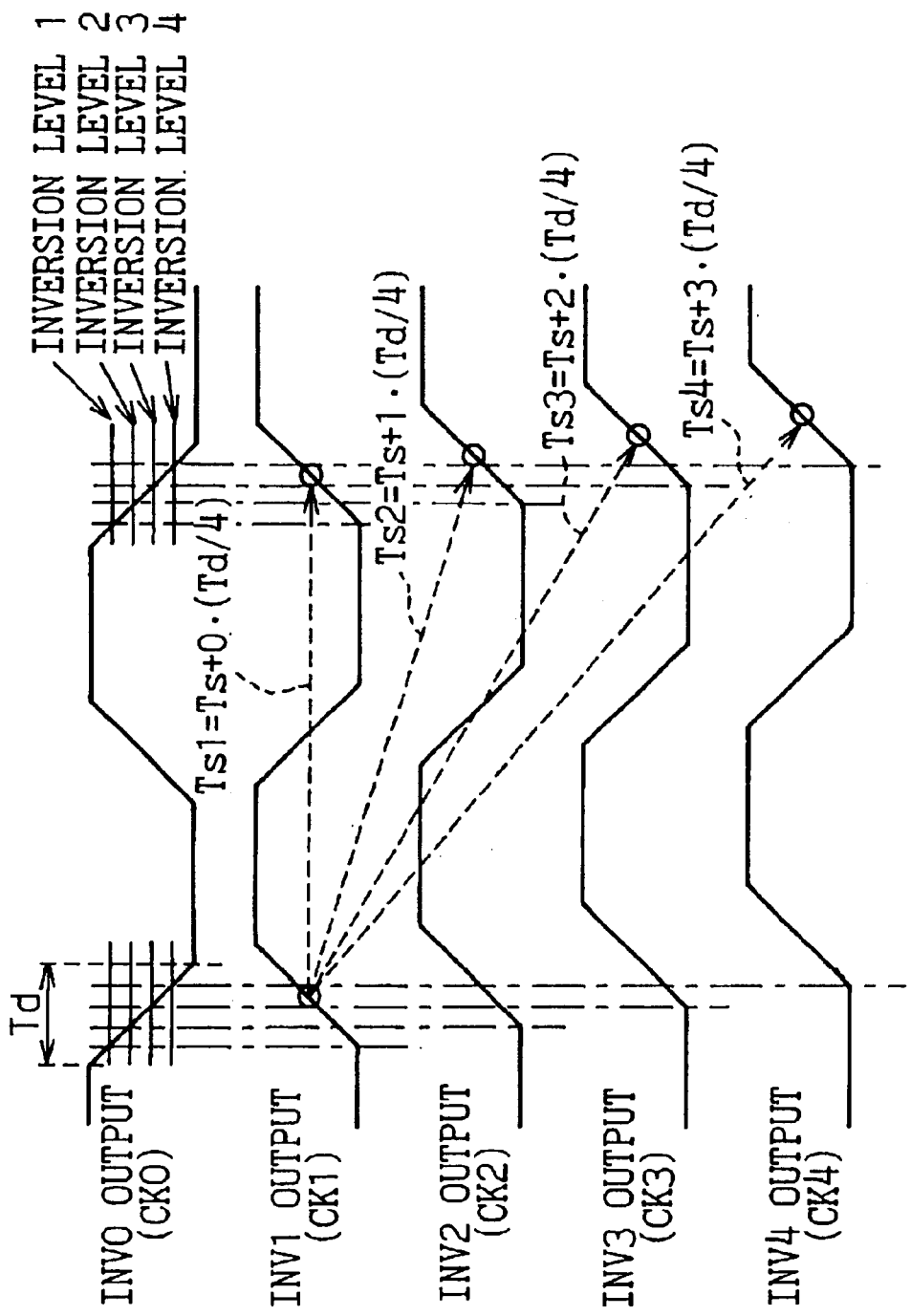

ANALOG-TO-DIGITAL CONVERSION METHOD AND DEVICE

BACKGROUND OF THE INVENTION

1. Field of the Invention

The present invention relates to an analog-to-digital (A/D) conversion method and device for converting an analog input signal into numerical data using a pulse delay circuit that has a plurality of delay units, which delay and transmit a pulse signal, connected in series with one another.

2. Description of the Related Art

In the past, A/D conversion devices known as types of A/D conversion devices that provides high-resolution digital data despite a simple configuration include a pulse delay circuit that has a plurality of delay units, which are realized with various kinds of gate circuits, connected annularly. In the A/D conversion device, an analog input signal, that is an object of A/D conversion, is transmitted as a supply voltage to the pulse delay circuit. At the same time, a transmission pulse signal is applied to the pulse delay circuit. Consequently, the pulse signal is circulated through the pulse delay circuit at a speed dependent on the delay time of the delay units. The number of delay units in the pulse delay circuit through which the pulse signal passes within a predetermined sampling time during the circulation of the pulse signal is counted. Thus, the analog input signal is converted to numerical data (refer to, for example, Japanese Unexamined Patent Application Publication No. 5-259907).

The A/D conversion device utilizes the fact that a delay time to be given by the delay units varies depending on a supply voltage. Since an analog input signal is transmitted as a supply voltage to the delay units included in the pulse delay circuit, the speed at which a pulse signal circulates through the pulse delay circuit is changed with the analog input signal. The moving speed is measured by counting the number of delay units through which the pulse signal has pass through within the predetermined sampling time. The result of the measurement (count value) is provided as numerical data resulting from A/D conversion.

According to the A/D conversion device, a voltage resolution to be expressed by resultant numerical data can be determined with a delay time given by one stage of a delay unit included in the pulse delay circuit and a sampling time required for A/D conversion. In order to increase the voltage resolution expressed by the numerical data, the delay time to be given by one stage of a delay unit is shortened or the sampling time is extended. Consequently, an A/D conversion device capable of realizing high-precision A/D conversion can be provided inexpensively with a simple configuration.

However, in the foregoing A/D conversion device, the delay time to be given by one stage of a delay unit included in the pulse delay circuit is determined by a fineness level (a rule for CMOS design). The fineness level indicates how fine circuit elements (inverters or other gate circuits) included in each delay unit are. Even if an attempt is made to shorten a delay time of one stage of a delay unit included in the pulse delay circuit for the purpose of improving a resolution to be offered through A/D conversion, there are limitations.

Moreover, when, in the A/D conversion device, the sampling time required for A/D conversion is extended in order to improve a resolution to be offered through A/D conversion, and the A/D conversion device is employed in a system required to achieve high-speed A/D conversion at an A/D conversion speed ranging from, for example, several megahertz to several tens of megahertz, the system would suffer from insufficient speed. The system could not satisfy a requirement for high-speed A/D conversion.

The foregoing A/D conversion device is a so-called integrating type A/D conversion device. Produced digital data is a result of integration performed on a variable component of an analog input signal over a sampling time required for A/D conversion. Therefore, if the sampling time required for A/D conversion is extended in order to improve a resolution to be offered through A/D conversion, quantity of variation of the analog input signal cannot be reflected on the resultant digital data. The A/D conversion device cannot be employed in a system requested to achieve high-speed A/D conversion.

Therefore, a system that requires the speed and precision of A/D conversion conventionally employs a successive approximation type A/D conversion device or a parallel type A/D conversion device (also called a flash type A/D conversion device). The successive approximation type A/D conversion device can achieve A/D conversion at a higher speed than the aforesaid integrating type A/D conversion device can. The parallel type A/D conversion device can achieve A/D conversion instantaneously.

In order to improve the resolution offered through A/D conversion by the successive approximation type A/D conversion device or parallel type A/D conversion device, numerous reference voltages must be produced according to the required resolution. Therefore, a system that requires the speed and precision of A/D conversion must employ an expensive A/D conversion device having a complex configuration. This invites an increase in the cost of the entire system.

SUMMARY OF THE INVENTION

The present invention attempts to solve the foregoing problem. Accordingly, an object of the present invention is to provide an A/D conversion method for converting an analog signal into digital data at high speed with high precision using an A/D conversion device that can be realized inexpensively with a simple configuration, and the A/D conversion device.

According to an A/D conversion method in which a first embodiment of the present invention is implemented in order to accomplish the object, a delay time to be given by delay units constituting a pulse delay circuit is changed with an analog input signal. A pulse signal is applied to the pulse delay circuit and transferred within the pulse delay circuit. The position of the pulse signal within the pulse delay circuit is numerically expressed at a plurality of different timings. The results of the numerical expression are summated in order to produce numerical data representing the analog input signal.

According to the A/D conversion method of the present invention, similarly to the method implemented in the aforesaid conventional A/D conversion device, the pulse delay circuit is used to convert the analog input signal into numerical data. During the A/D conversion, the position of the pulse signal within the pulse delay circuit is not numerically expressed at the timing that a predetermined time has elapsed since the pulse signal is applied to the pulse delay circuit, but numerically expressed at a plurality of different timings. The results of the numerical expression are summated in order to produce numerical data.

Herein, the number of bits constituting numerical data that results from the numerical expression of the position of the pulse signal within the pulse delay circuit is n, and the number of numerical data items produced at the plurality of different timings is m. In this case, the number of bits constituting numerical data produced by the A/D conversion method of the present invention is provided as $n+\log_2 m$.

The numerical data $n+\log_2 m$ bits long corresponds to an average of numerical data items produced at the plurality of different timings. Consequently, a voltage resolution expressed by final numerical data is higher than that expressed by numerical data produced according to the conventional method.

According to the A/D conversion method of the present invention, the action of numerically expressing the position of the pulse signal within the pulse delay circuit is not merely performed a plurality of times. The plurality of timings at which the numerical expression is performed is differentiated from one another. The time required for A/D conversion is not longer than the one required according to the conventional method. A/D conversion can be achieved with high precision by taking the same time as the one required by the conventional method. Moreover, if a voltage resolution expressed by numerical data resulting from summation may be of the same level as the one provided by the conventional method, the time required for A/D conversion can be shortened.

According to the A/D conversion method of the present invention, an A/D conversion device capable of converting an analog input signal into digital data at a higher speed with higher precision can be realized without the necessity of shortening a delay time to be given by one stage of a delay unit or of extending a sampling time.

Moreover, unlike the successive approximation type or parallel type A/D conversion device, the A/D conversion device need not produce a reference voltage with which an analog input signal is compared. The A/D conversion device can be realized inexpensively with the configuration thereof simplified. Consequently, by utilizing the method of the present invention, a system that requires speed and precision in A/D conversion can be realized at a lower cost than a conventional system can.

Herein, the number of pulse delay circuits employed in A/D conversion may be identical to the number of timings at which the numerical expression is performed. More preferably, one pulse delay circuit is, as it is in a second embodiment, used to numerically express the position of a pulse signal. The position of the pulse signal within the pulse delay circuit is numerically expressed at different timings.

In this way, the configuration of an A/D conversion device in which the method of the present invention is implemented can be simplified. Moreover, numerical data items produced at the respective timings can be prevented from becoming uncertain because of differences among a plurality of pulse delay circuits occurring in the process of manufacture. Consequently, a result of A/D conversion can be provided with higher precision.

According to the method of the present invention, the analog input signal is used to change the delay time to be given by the delay units constituting the pulse delay circuit. As for a method of changing the delay time, which is given by the delay units, using the analog input signal, for example, a method employed in a third embodiment may be adopted. Namely, the analog input signal may be applied as a driving voltage, with which the delay units are driven, to the pulse delay circuit. Otherwise, the analog input signal may be, as it is in a fourth embodiment, applied as a signal, with which a driving current flowing into the delay units is controlled, to the pulse delay circuit.

Specifically, each of the delay units constituting the pulse delay circuit is normally composed of inverters or other gate circuits. The larger a driving voltage or driving current, the higher the operating speed of each delay unit. Therefore, according to the third or fourth embodiment, the analog input signal is applied as a driving voltage control signal or a driving current control signal, with which a driving voltage or current input to the delay units is controlled, to the pulse delay circuit. Thus, the delay time to be given by the delay units constituting the pulse delay circuit can be changed readily according to the voltage level of the analog input signal.

On the other hand, according to the method of the present invention, the position of a pulse signal within the pulse delay circuit is numerically expressed at the aforesaid timings. An average of the results of numerical expression is used to produce numerical data representing the analog input signal. This sequence of A/D conversion may be performed once after application of the pulse signal to the pulse delay circuit. However, when A/D conversion is performed according to the sequence, the continuously variable analog input signal cannot be sequentially analog-to-digital converted (A/D-converted) at a high speed.

In order to repeatedly analog-to-digital convert (A/D-convert) an analog input signal at intervals of a predetermined A/D conversion cycle in the same manner as in a typical A/D conversion device, a plurality of numerical data items to be summated may be produced according to a procedure employed in a fifth embodiment.

In an A/D conversion method of the fifth embodiment, the position of a pulse signal within a pulse delay circuit is repeatedly numerically expressed synchronously with a plurality of sampling clocks that have the same cycle but are out of phase with one another. Based on a deviation of new data representing the numerically expressed position of the pulse signal from previous data representing it, the number of delay units within the pulse delay circuit through which the pulse signal has passed during one cycle of the sampling clocks is calculated. Thus, a plurality of numerical data items to be summated is produced.

Consequently, when the numerical data items are summated synchronously with one of the plurality of sampling clocks, a result of A/D conversion performed on an analog input signal can be obtained once each cycle of the sampling clock. Eventually, A/D conversion of the analog input signal can be achieved repeatedly at a high speed with high precision.

As mentioned above, a plurality of sampling clocks is used to express the number of delay units, through which a pulse signal has passed within a pulse delay circuit, during one cycle of the sampling clocks so as to produce numerical data items. In this case, the sampling clocks should be out of phase with one another.

The sampling clocks to be applied to each pulse position numerizing means are out of phase with each other by a difference, which ranges from several tens of picosecond to several nanosecond, because of a jitter stemming from white noise occurring within the circuit. A phase difference is also caused by a difference of the length of an input path along which one sampling clock is applied to each pulse position numerizing means from the length of an input path along with another sampling clock is applied thereto.

A phase of the sampling clocks to be applied to each pulse position numerizing means need not be intentionally make different one another in order to improve a resolution to be offered through A/D conversion. Preferably, the phases of the sampling clocks are determined as they are in a sixth embodiment, so that the timings of numerical expressions determined with the respective sampling clocks will be different from one another by certain times. More preferably, the phases of the sampling clocks are determined as they are in a seventh embodiment, so that the timings of numerical expression synchronous with the respective sampling clocks are different from one another at even intervals of one cycle of each sampling clock.

In other words, when the phases of the sampling clocks are determined as they are in the sixth embodiment, the timings of numerical expression performed for producing numerical data items that are to be summated are different from one another by an equal duration. Consequently, by summating the numerical data items, numerical data representing a continuously variable analog input signal can be averaged accurately. This results in improved precision in A/D conversion.

Moreover, the phases of the sampling clocks may be determined as they are in a seventh embodiment. Especially in this case, numerical data items produced synchronously with the respective sampling clocks may be summated at the respective timings of the rising or falling edges of the associated sampling clocks. Therefore, numerical data resulting from A/D conversion of an analog input signal can be produced a plurality of times within one cycle of the sampling clocks. Thus, A/D conversion can be achieved at a higher speed.

Moreover, when a plurality of sampling clocks is, as mentioned above, used to produce numerical data items to be summated, a time calculated by adding a maximum value of a phase difference between sampling clocks to the cycle of the sampling clocks may be longer than the time from the instant a pulse signal was applied to the pulse delay circuit to the instant the pulse signal passes through all the delay units included in the pulse delay circuit. This makes it impossible to produce numerical data expressing the number of delay units through which the pulse signal passes within the pulse delay circuit during one cycle of the sampling clocks. Eventually, an analog input signal cannot be A/D-converted highly precisely.

In order to implement the A/D conversion method of the fifth embodiment, the sampling clocks are preferably defined as they are in an eighth embodiment. Preferably, the time which is calculated by adding a maximum value of a phase difference between sampling clocks to the cycle of the sampling clocks should be equal to or shorter than at least the time from the instant a pulse signal was applied to the pulse delay circuit to the instant the pulse signal passes through all the delay units included in the pulse delay circuit.

By the way, as mentioned above, numerical data items to be summated are repeatedly produced using a plurality of sampling clocks. In this case, if the pulse delay circuit is formed as a delay line that transmits a pulse signal, the number of delay units constituting the pulse delay circuit must be very large. However, if the number of delay units increases, the number of circuit elements (including transistors) constituting the pulse delay circuit increases. This invites an increase in the scale of circuitry.

In order to implement the A/D conversion method of the fifth embodiment, more preferably, a procedure employed in a ninth embodiment is adopted. Specifically, a pulse circulation circuit which has delay units concatenated annularly and through which a pulse signal is circulated is adopted as the pulse delay circuit. A circulation-number counter is used to count the number of times by which the pulse signal has circulated through the pulse circulation circuit after being applied to the pulse circulation circuit. The position of the pulse signal within the pulse circulation circuit is numerically expressed synchronously with an associated one of the sampling clocks. Numerical data having as low-order bit data numerical data resulting from the numerical expression, and having as high-order bit data the number of times by which the pulse signal is circulated and which is counted by the circulation-number counter is produced. Based on a deviation of a new one of the produced numerical data from previous one thereof, the number of delay units through which the pulse signal has passed during one cycle of the sampling clocks is calculated.

In this case, the pulse signal repeatedly passes through the annularly concatenated delay units in the pulse delay circuit. Even if the number of delay units constituting the pulse delay circuit is decreased, A/D conversion can be repeatedly performed over a prolonged period of time.

In this case, the cycle of the sampling clocks may get longer than the time from the instant the pulsating signal was applied to the pulse delay circuit to the instant the circulation-number counter overflows. In this case, the circulation-number counter overflows a plurality of times within one cycle of the sampling clocks. Consequently, the number of times by which the pulse signal has circulated through the pulse delay circuit (pulse circulation circuit) within one cycle of the sampling clocks cannot be calculated accurately from a count value presented by the circulation-number counter. Eventually, an analog input signal cannot be A/D-converted highly precisely.

In order to implement the A/D conversion method of the ninth embodiment, preferably, the sampling clocks are defined as they are in a tenth embodiment. Specifically, the sampling clocks are defined so that the cycle of the sampling clocks will be equal to or shorter than the time from the instant a pulse signal was applied to the pulse delay circuit to the instant the circulation-number counter overflows.

According to the A/D conversion methods described as the fifth embodiment to the tenth embodiment, the plurality of sampling clocks that has the same cycle but is out of phase with one another is employed, and A/D conversion is performed synchronously with the respective sampling clocks. A sampling time per A/D conversion that is performed using the sampling clocks (in other words, the sensitivity offered through A/D conversion) remains constant. The sensitivity to an analog input signal offered by the result (numerical data) of A/D conversion achieved using the sampling clocks remains constant.

Consequently, a resolution expressed by final numerical data calculated by summating the results of A/D conversion is improved according to the number m of sampling clocks. However, as long as an analog input signal remains constant and within a resolution, which is offered through A/D conversion performed using the sampling clocks, the finally produced numerical data always assumes a fixed value. The resolution expressed by the numerical data cannot be improved.

In order to improve the resolution expressed by final numerical data, the sampling time per A/D conversion (in other words, the sensitivity offered through A/D conversion) should be changed for each of the plurality of times of A/D conversion. For this purpose, any of A/D conversion methods provided as eleventh to fifteenth embodiments may be adopted.

According to the A/D conversion method of the eleventh embodiment, the position of a pulse signal that changes within a pulse delay circuit is numerically expressed during sampling times that are different from one another by a predetermined unit time. Thus, a plurality of numerical data items to be summated is produced.

According to the A/D conversion method of the eleventh embodiment, the position of a pulsating signal that changes within the pulse delay circuit is not numerically expressed during the same sampling time determined with the cycle of the sampling clocks. Instead, the position of the pulsating signal that changes within the pulse delay circuit is numerically expressed during the respective sampling times which are different from one another by the predetermined unit time.

Consequently, according to the A/D conversion method of the eleventh embodiment, the sensitivity offered at each time of A/D conversion performed for producing numerical data items to be summated varies depending on a difference between adjoining sampling times. Eventually, the resolution expressed by numerical data finally produced by summating the results of A/D conversion can be improved more successfully than it can according to the A/D conversion methods of the fifth to tenth embodiments.

Moreover, when A/D conversion is performed within the pulse delay circuit, a resolution exhibited by numerical data that is a result of A/D conversion is determined with a delay time Td to be given by one stage of a delay unit included in the pulse delay circuit. In order to A/D-convert an analog input voltage more accurately according to the A/D conversion method of the eleventh embodiment, a unit time by which a sampling time is different from an adjoining sampling time may be determined as it is in a twelfth embodiment. Specifically, the unit time by which one sampling time is different from an adjoining sampling time is set to a time (Td/m) calculated by dividing a delay time (Td) to be given by the delay units constituting the pulse delay circuit by the number (m) of sampling times. Otherwise, the unit time is set to a time calculated by adding an integral multiple (Td, 2Td, 3Td, etc.) of the delay time (Td) to be given by the delay units to the time Td/m.

In this case, resolutions exhibited by numerical data items produced during each sampling times (in other words, voltage levels corresponding to the least significant bits of the respective numerical data items) are different from each other by 1/m of a resolution determined with the delay time (Td) to be given by the delay units that delay the pulse signal within the pulse delay circuit. Consequently, a resolution expressed by numerical data finally produced through summation can be improved.

According to the A/D conversion method of the eleventh embodiment, A/D conversions are performed a plurality of times during different sampling times, using the pulse delay circuit. For each A/D conversion, a plurality of sampling times must be determined. For determining the sampling times, m sampling clocks having the same cycle and being out of phase with one another by a unit time may be employed according to a thirteenth embodiment.

In this case, the sampling clocks may be, according to a fourteenth embodiment, readily produced by delaying a reference clock having a certain cycle by times that are integral multiples of the unit time.

However, according to the A/D conversion method of the thirteenth embodiment, all the sampling clocks have the same cycle. In order to define m sampling times, which are different from one another, using the sampling clock having the same clock, the sampling times are preferably determined as according to a fifteenth embodiment. Specifically, one of m sampling times is set to a period from the rising or falling edge of a specific sampling clock, which phase leads to the maximum among the m sampling clocks, to the next rising or falling edge thereof. The other sampling times are set to periods from the rising or falling edge of the specific sampling clock to the rising or falling edges of the other sampling clock.

In this case, one of the m sampling times equals a reference cycle Ts synchronous with the cycle of the specific sampling clock. The cycle of the other sampling clock equals a time (Ts+1×unit time, Ts+2×unit time, Ts+3× unit time, etc.) calculated by adding an integral multiple of a unit time (1×unit time, 2×unit time, 3×unit time, etc.) to the reference cycle Ts. Consequently, the A/D conversion method (provided as the eleventh or twelfth embodiment of the present invention) in which the present invention is implemented can be realized readily.

As mentioned above, according to the A/D conversion methods of the eleventh to fifteenth embodiments, the position of a pulse signal that changes within the pulse delay circuit is expressed numerically during sampling times which are different from one another by a predetermined unit time. Thus, a plurality of numerical data items exhibiting different resolutions is produced, and then summated. Consequently, an analog input signal is A/D-converted with high precision. Ideas implemented in the A/D conversion methods of the eleventh to fifteenth embodiments can be adapted not only to the integrating type A/D conversion device having the pulse delay circuit but also to the other integrating type A/D conversion devices including, for example, a double integral (sequential integral) type A/D conversion device. Moreover, the ideas can be adapted to other types of A/D conversion devices including the successive approximation type A/D conversion device and parallel type A/D conversion device.

According to the sixteenth embodiment, a plurality of A/D conversion circuits that offer different voltage resolutions which are exhibited by numerical data items that are results of A/D conversion is used to numerically express an analog input signal. The results of numerical expression performed by the respective A/D conversion circuits are summated in order to produce numerical data representing the analog input signal. Thus, the same technological ideas as those implemented in the eleventh embodiment can be adapted not only to the A/D conversion device having the pulse delay circuit but also to the other integrating types A/D conversion devices or the successive approximation type or parallel type A/D conversion device. The same advantages as those of the eleventh embodiment can be provided.

However, in this case, in order to achieve A/D conversion as precisely as that according to the twelfth embodiment, voltage resolutions to be offered by the A/D conversion circuits are preferably determined according to a seventeenth embodiment. Specifically, the voltage resolutions to be offered by the A/D conversion circuits are set to resolutions obtained by shifting a predetermined reference resolution in units of a unit resolution calculated by dividing the predetermined reference resolution by the number of A/D conversion circuits.

The following eighteenth to twenty-fifth embodiments are concerned with A/D conversion devices suitable for implementing the aforesaid A/D conversion methods (provided especially as the first to tenth embodiments) of the present invention.

The A/D conversion device of the eighteenth embodiment includes a pulse delay circuit having a plurality of delay units connected in series with one another. Each of the delay units delays a pulse signal by a delay time corresponding to the voltage level of an analog input signal, and transfers the resultant signal. Moreover, m pieces of pulse position numerizing means detect the position of the pulse signal within the pulse delay circuit at the respective timings of the rising or falling edges of m sampling clocks that are out of phase with one another. The detected positions of the pulse signal are expressed numerically. An adding means summates numerical data items produced by the respective pieces of pulse position numerizing means, and transmits the result of the summation as numerical data representing the analog input signal.

In the A/D conversion device, an analog input signal can be converted into numerical data according to the A/D conversion method of the first embodiment. Compared with the aforesaid conventional A/D conversion device, the analog input signal can be A/D-converted at a high speed with high precision without the necessity of shortening a delay time to be given by one stage of a delay unit.

The A/D conversion device of the nineteenth embodiment is identical to the A/D conversion device of the eighteenth embodiment except that clock signals which vary at intervals of the same cycle are used as the m sampling clocks. The pieces of pulse position numerizing means repeatedly numerically express the position of a pulse signal within the pulse delay circuit at the respective timings of the rising or falling edges of the associated sampling clocks. A deviation of new data representing the numerically expressed position of the pulse signal from previous data representing it is calculated in order to produce numerical data expressing the number of delay units within the pulse delay circuit through which the pulse signal has passed within one cycle of the sampling clocks.

In the A/D conversion device of the nineteenth embodiment, the analog input signal can be converted into numerical data according to the A/D conversion method of the fifth embodiment. A/D conversion of the analog input signal can be repeatedly performed at intervals of a certain cycle corresponding to the cycle of the sampling clocks.

Moreover, the A/D conversion device of the twentieth embodiment includes a pulse circulation circuit, which has delay units concatenated annularly, as a pulse delay circuit. A pulse signal is circulated through the pulse circulation circuit. A circulation-number counter counts the number of times by which the pulse signal has circulated through the pulse circulation circuit.

Each of the pieces of pulse position numerizing means has a pulse position detecting circuit that numerically expresses the position of the pulse signal within the pulse circulation circuit at the timing of the rising or falling edge of an associated sampling clock. An arithmetic circuit included in each of the pieces of pulse position numerizing means calculates a deviation of new numerical data, which has as low-order bit data thereof numerical data produced by the pulse position detecting circuit and has as high-order bit data thereof numerical data produced by the circulation-number counter, from a previous one thereof. The calculated deviation is used to calculate the number of delay units within the pulse delay circuit through which the pulse signal has passed within one cycle of the sampling clocks.

In the A/D conversion device of the twentieth embodiment, an analog input signal can be converted into numerical data according to the A/D conversion method of the ninth embodiment. Although the number of delay units constituting the pulse delay circuit is decreased, A/D conversion can be repeatedly performed over a prolonged period of time.

The A/D conversion device of the twenty-first embodiment has, in addition to the same components as the A/D conversion device of the twentieth embodiment, an input circuit. The input circuit selectively receives a pulse signal from the delay unit of the last stage included in the pulse delay circuit and a test clock used to test the counting action of the circulation-number counter.

In the A/D conversion device of the twenty-first embodiment, a test clock is transferred to the circulation-number counter via the input circuit. The counting action of the circulation-number counter can be tested. The action performed in the A/D conversion device (or the circulation-number counter) can be verified easily.

The A/D conversion devices of the nineteenth to twenty-first embodiments repeatedly perform A/D conversion using m sampling clocks that vary at intervals of a certain cycle. Among the A/D conversion devices, the A/D conversion device of the nineteenth embodiment does not use the pulse circulation circuit serving as the pulse delay circuit. Preferably, the A/D conversion method of the eighth embodiment is adapted to the A/D conversion device of the nineteenth embodiment. Namely, the sampling clocks are defined so that a time calculated by adding a maximum value of a phase difference between adjoining sampling clocks to the cycle of each sampling clock is equal to or shorter than the time from the instant the pulsating signal was applied to the pulse delay circuit to the instant the pulsating signal has passed through all the delay units included in the pulse delay circuit.

Preferably, the A/D conversion method of the tenth embodiment is adapted to the A/D conversion device of the twentieth or twenty-first embodiment that uses the pulse circulation circuit as the pulse delay circuit. Namely, the sampling clocks are defined so that the cycle of the sampling clocks is equal to or shorter than the time from the instant the pulsating signal is applied to the pulse delay circuit to the instant the circulation-number counter overflows.

Preferably, the A/D conversion method of the second embodiment is adapted to the A/D conversion devices of the eighteenth to twenty-first embodiments. Namely, one pulse delay circuit (or one pulse circulation circuit) is used to numerically express the position of a pulse signal.

When a delay time to be given by the delay units constituting the pulse delay circuit (or pulse circulation circuit) is changed corresponding to an analog input signal, the A/D conversion method of the third embodiment may be adopted. Consequently, the analog input signal may be used as a driving voltage with which the delay units are driven. Otherwise, according to the A/D conversion method of the fourth embodiment, a driving current flowing into the delay units may be controlled based on the analog input signal.

Preferably, the A/D conversion method of the sixth embodiment is adapted to the A/D conversion devices of the nineteenth to twenty-first embodiments that repeatedly perform A/D conversion using the m sampling clocks that vary at intervals of a certain cycle. Namely, the sampling clocks are defined so that a phase difference between adjoining sampling clocks will always be set to the same time. More preferably, the A/D conversion method of the seventh embodiment is adapted. Namely, the sampling clocks are defined so that a phase difference between adjoining sampling clocks will correspond to 1/m of one cycle of the sampling clocks.

Especially in the A/D conversion device of the nineteenth embodiment, when a phase difference between adjoining ones of the m sampling clocks corresponds to 1/m of one cycle of each of the sampling clocks, an adding means is configured like the one included in a twenty-second embodiment.

In an A/D conversion device provided as the twenty-second embodiment, the adding means fetches numerical data items from the respective pieces of pulse position numerizing means synchronously with the rising or falling edges of the m sampling clocks applied to the respective pieces of pulse position numerizing means. The adding means then summates the m fetched numerical data items so as to produce numerical data representing an analog input signal at intervals of 1/m of the cycle of the sampling clocks.

In the A/D conversion device, A/D conversion of the analog input signal can be performed at a high speed at intervals of the 1/m of one cycle of the sampling clocks. If the A/D conversion device is adapted to a system that is required to perform A/D conversion at a high speed, more advantages could be provided.

In the A/D conversion device of the nineteenth embodiment, a phase difference between adjoining ones of the m sampling clocks is set to a certain duration corresponding to a 1/m of one cycle of each sampling clock. For this purpose, for example, a sampling clock generating circuit is included as it is in a twenty-third embodiment. Specifically, the sampling clock generating circuit calculates a 1/m of the frequency of an externally applied reference clock, and successively produces m shift clocks which are out of phase with one another by a phase difference corresponding to one cycle of the reference clock. The sampling clock generating circuit then transmits the m shift clocks as sampling clocks.

In an A/D conversion device of the twenty-third embodiment, the cycle of the externally applied reference clock corresponds to a 1/m of the cycle of the sampling clocks that are applied to the respective pieces of pulse position numerizing means. The reference clock may be used as an operating clock synchronously with which the adding means operates (in other words, an operating clock for A/D conversion), and applied to the adding means. In this case, the A/D conversion device of the twenty-second embodiment can be constructed.

In the A/D conversion device of the twenty-third embodiment, the sampling clock generating circuit is realized with a frequency division circuit including a counter. When the frequency of the externally applied reference clock ranges, for example, from 1 MHz to 10 MHz or is a high frequency equal to or higher than 10 MHz, the sampling clock generating circuit may operate too slowly to produce m shift clocks. In this case, the sampling clock generating circuit is configured like the one included in a twenty-fourth embodiment.

Namely, the sampling clock generating circuit included in an A/D conversion device of the twenty-fourth embodiment comprises a delay line and m−1 groups of switches. The delay line includes a plurality of delay units which gives a predetermined delay time. A reference clock is transferred while being sequentially delayed by a plurality of stationary delay units. Each of the m−1 groups of switches includes a plurality of switches. The switches belonging to each group each have one contact thereof connected to the output node of the respective delay unit included in the delay line, and have the other contact thereof connected to an output path of each shift clock.

In the sampling clock generating circuit, a time A/D conversion means numerically expresses the cycle of an externally applied reference clock. Pieces of switch selecting means multiply numerical data, which is produced by the time A/D conversion means and divided by m, by integers 1 to m−1, and thus produce m−1 numerical data items. Based on the produced numerical data items, the locations of switches that should be turned on and those belong to the respective groups of switches are specified. The switches at the specified locations are selectively turned on, whereby m−1 shift clocks are produced by sequentially delaying a reference clock by a duration that corresponds to a 1/m of the cycle of the reference clock. The shift clocks are transmitted along the output paths extending from the respective groups of switches. The sampling clock generating circuit transmits the reference clock and the m−1 shift clocks, which are transmitted along the output paths extending from the respective groups of switches, as m sampling clocks.

In the A/D conversion device of the twenty-fourth embodiment, the sampling clock generating circuit delays the reference clock by a delay time to be given by the delay units constituting the delay line. Herein, the delay time is regarded as a temporal resolution offered by the A/D conversion device. Consequently, the sampling clock generating circuit produces m−1 shift clocks by shifting the phase of the reference clock. The sampling clock generating circuit transmits the shift clocks and reference clock as the m sampling clocks.

In the A/D conversion device of the twenty-fourth embodiment, even if the frequency of an externally applied reference clock ranges, for example, from 1 MHz to 10 MHz or is equal to or higher than 10 MHz, the sampling clock generating circuit produces the m sampling clocks, which are out of phase with one another by a 1/m of the cycle of the reference clock, with high precision.

In the A/D conversion device of the twenty-third embodiment, the cycle of an externally applied input clock may not be a 1/m of the cycle of the sampling clocks that are applied to the respective pieces of pulse position numerizing means. In the A/D conversion device of the twenty-fourth embodiment, the cycle of an externally applied input clock may not be the same as the cycle of the sampling clocks that are applied to the respective pieces of pulse position numerizing means. In this case, a reference clock producing circuit may be included as it is in a twenty-fifth embodiment. Specifically, the reference clock producing circuit produces a reference clock having a desired frequency by multiplying or dividing the frequency of an externally applied input clock by a certain value. The reference clock produced by the reference clock producing circuit is applied to the sampling clock generating circuit.

The following twenty-sixth to thirty-fifth embodiments are related to preferred A/D conversion devices to which the A/D conversion methods of the eleventh to seventeenth embodiments are adapted.

First, in the A/D conversion device of the twenty-sixth embodiment, a plurality of A/D conversion circuits that offer different voltage resolutions (or in other words, different sensitivities for A/D conversion) which are expressed by numerical data items that are results of A/D conversion is used to numerically express an analog input signal. An adding means summates the results of the numerical expression produced by the respective A/D conversion circuits.

According to the A/D conversion device of the twenty-sixth embodiment, a resolution expressed by final numerical data can be improved without the necessity of improving resolutions offered by the A/D conversion circuits.

In order to realize the A/D conversion device of the twenty-sixth embodiment for the purpose of improving the precision in final numerical data, voltage resolutions offered by the A/D conversion circuits are preferably set to resolutions determined by shifting a predetermined reference resolution in units of a unit resolution calculated by dividing the predetermined reference resolution by the number of A/D conversion circuits.

The aspect of the present invention implemented in the twenty-sixth embodiment can be adapted not only to the A/D conversion device using a pulse delay circuit but also so other integrating type A/D conversion devices including a double integral type A/D conversion device or the other types of A/D conversion devices including the successive approximation type and parallel type A/D conversion devices. In order to simplify the configuration of an A/D conversion device so as to reduce a cost, a pulse delay circuit like the one included in an A/D conversion device of a twenty-seventh embodiment is adopted. Specifically, the pulse delay circuit has a plurality of delay units, which delays a pulse signal by a delay time dependent on the voltage level of an analog input signal and which transmits the resultant pulse signal, connected in series with one another. Moreover, a plurality of A/D conversion circuits is realized with m pieces of pulse position numerizing means that numerically express the position of a pulsating signal, which varies within the pulse delay circuit, during respective sampling times that are different from one another by a predetermined unit time.

In this case, similarly to the A/D conversion devices of the eighteenth to twenty-fifth embodiments, the pulse position numerizing means that need not produce a reference voltage for A/D conversion can be used to A/D-convert the analog input signal. Consequently, the A/D conversion device can be realized inexpensively with a simple configuration.

In the A/D conversion device of the twenty-seventh embodiment, an analog input signal is A/D-converted according to the method of the eleventh embodiment. Compared with the A/D conversion devices of the eighteenth to twenty-fifth embodiments, a resolution expressed by final numerical data improves and the precision in A/D conversion improves.

In the A/D conversion device of the twenty-seventh embodiment, a difference (that is, a unit time) between adjoining ones of the sampling times during which the position of a pulse signal changing within the pulse delay circuit is numerically expressed by the pieces of pulse position numerizing means is preferably determined as it is in a twenty-eighth embodiment. Specifically, the difference between adjoining sampling times is set to a time (Td/m) calculated by dividing a delay time (Td) to be given by the delay units constituting the pulse delay circuit by the number (m) of pieces of pulse position numerizing means. Otherwise, the difference between adjoining sampling times is set to a time calculated by adding an integral multiple of the delay time (Td) to be given by the delay units to the time Td/m.

In this case, resolutions expressed by numerical data items produced by the respective pieces of pulse position numerizing means (in other words, voltage levels corresponding to least-significant bits of the respective numerical data items) are different from one another by a 1/m of a resolution determined with the delay time (Td) by which the delay units included in the pulse delay circuit delay the pulsating signal. Consequently, a resolution expressed by final numerical data resulting from summation improves.

Incidentally, in order to realize the A/D conversion device of the twenty-seventh embodiment, the m pieces of pulse position numerizing means must be operated at intervals of different sampling times. For this purpose, a sampling clock generating circuit for generating m sampling clocks that have a certain cycle and that are out of phase with one another by a unit time is included as it is in a twenty-ninth embodiment. Moreover, the m pieces of pulse position numerizing means use the m respective sampling clocks generated by the sampling clock generating circuit to numerically express the position of a pulsating signal that changes within the pulse delay circuit.

In this case, the sampling clock generating circuit includes, like the one included in a thirtieth embodiment, m delay units that give delay times different from one another by a unit time. The m delay units are used to delay a reference clock having a certain cycle, whereby the m sampling clocks are produced.

Furthermore, when the sampling clock generating circuit is used to produce the m sampling clocks, the m delay units included in the sampling clock generating circuit are, as they are in a thirty-first embodiment, realized with inverters that invert the voltage level of an input signal at different inversion levels which are the voltage levels of a varying input signal. The inversion timings at which the inverters invert the input signal along with a change in the voltage level of a reference clock are different from one another. Consequently, the reference clock is delayed by delay times that are different from one another by a unit time.

Especially in the A/D conversion device of the thirty-first embodiment, similarly to the A/D conversion device of the twenty-eighth embodiment, the sampling times during which the respective pieces of pulse position numerizing means numerically express the position of a pulse signal that changes within the pulse delay circuit are differentiated from one another by a 1/m of the delay time (Td) given by the delay units constituting the pulse delay circuit. In this case, an output level transition time Tf, during which the levels of the outputs of the respective inverters realizing the m delay units included in the sampling clock generating circuit make a transition, is, as it is in a thirty-second embodiment, made nearly equal to the delay time Td to be given by one stage of a delay unit included in the pulse delay circuit.

In this case, the inversion levels of the m inverters realizing the m delay units included in the sampling clock generating circuit should merely be regulated. Thus, a difference between inversion timings of adjoining inverters can be readily set to a 1/m of the delay time Td to be given by one stage of a delay unit included in the pulse delay circuit. Consequently, the A/D conversion device of the twenty-eighth embodiment can be relatively easily realized.

The delay time to be given by the delay units constituting the pulse delay circuit changes according to an analog input signal that is an object of A/D conversion. In the A/D conversion device of the thirty-second embodiment, similarly to an A/D conversion device of a thirty-third embodiment, the inverters realizing the m delay units included in the sampling clock generating circuit are operated using an analog input signal as a supply voltage.

In this case, even if the delay time Td to be given by the delay units constituting the pulse delay circuit changes along with an analog input signal, the output level transition time Tf during which the output levels of the inverters realizing the m delay units included in each sampling clock generating circuit make a transition can be changed proportionally to the change in the delay time. Consequently, a resolution expressed by final numerical data resulting from summation can be prevented from changing depending on the variation of the analog input signal.

On the other hand, in the A/D conversion devices of the twenty-ninth to thirty-third embodiments, the m pieces of pulse position numerizing means numerically express the position of a pulsating signal, which varies within the pulse delay circuit, using the m respective sampling clocks produced by the sampling clock generating circuit. Specifically, the position of the pulse signal that varies within the pulse delay circuit is expressed numerically during the time from the rising (or falling) edge of an associated sampling clock to the next rising (or falling) edge thereof. In this case, the sampling times during which the m respective pieces of pulse position numerizing means numerically express the position of the pulse signal are identical to one another. Therefore, during the sampling times from the common start timing serving as a reference to the rising (or falling) edges of the m sampling clocks produced by the sampling clock generating circuit, the respective pieces of pulse position numerizing means must numerically express the position of the pulse signal that varies within the pulse delay circuit (or in other words, the number of delay units the pulse signal passes through).

For the above purpose, a timing generating circuit for generating a signal indicating the common start timing that serves as a reference may be included independently of the sampling clock generating circuit. The timing generating circuit may inform the pieces of pulse position numerizing means of the timing of starting numerical expression. Otherwise, the reference clock which the sampling clock generating circuit uses to generate the m sampling clocks may be used to inform the pieces of pulse position numerizing means of the timing of starting numerical expression. For a simpler configuration, the pieces of pulse position numerizing means may be configured as they are in a thirty-fourth embodiment. Specifically, a sampling clock that leads other sampling clocks by phase among the m sampling clocks generated by the sampling clock generating circuit is regarded as a common clock. The pieces of pulse position numerizing means numerically express the position of a pulse signal, which varies within the pulse delay circuit, during the respective sampling times from the rising or falling edge of the common clock to the rising or falling edges of the sampling clocks associated with the respective pieces of pulse position numerizing means.

Moreover, in order to repeatedly perform A/D conversion, a specific numerizing means that is one of the m pieces of pulse position numerizing means is configured as it is in a thirty-fifth embodiment. Specifically, the specific numerizing means repeatedly numerically expresses the position of a pulse signal within the pulse delay circuit at the rising or falling edge of a sampling clock serving as a common clock. The specific numerizing means then transmits a deviation of new data representing the numerically expressed position of the pulse signal from previous data representing it as the result of the numerical expression to an adding means. The pieces of pulse position numerizing means other than the specific numerizing means are configured so that they will repeatedly numerically express the position of the pulse signal within the pulse delay circuit at the rising or falling edges of the respective sampling clocks associated with the pieces of pulse position numerizing means. The pieces of pulse position numerizing means then transmit a deviation of the data representing the numerically expressed position of the pulsating signal from the previous data produced by the specific numerizing means as the result of the numerical expression to the adding means.

In the A/D conversion device of the eighteenth or twenty-seventh embodiment including the pulse delay circuit, the delay units constituting the pulse delay circuit may be realized with any circuit as long as the circuit (generally, a gate circuit) can delay a pulse signal and transmit it. In order to simplify the delay unit to the greatest extent, the delay unit is, as it is in a thirty-sixth or thirty-seventh embodiment, realized with one stage of an inverter that inverts a pulse signal and transmits it. When the delay unit is realized with one stage of an inverter, a delay time to be given by one stage of a delay unit can be set to a very short time. Consequently, A/D conversion can be achieved at a higher speed.

However, in this case, a delay time that is to be given by an inverter and that corresponds to a period from the rising edge of an input pulse to the falling edge of an output pulse is different from a delay time that is to be given thereby and that corresponds to a period from the falling edge of the input pulse to the rising edge of the output pulse. Results of A/D conversion may be slightly different from one another. In order to prevent the differences, each delay unit may be, as it is in a thirty-eighth or thirty-ninth embodiment, composed of two stages of inverters connected directly to each other.

The A/D conversion device of the eighteenth or twenty-seventh embodiment including the pulse delay circuit has the plurality of pieces of pulse position numerizing means that numerically expresses the position of a pulsating signal within the pulse delay circuit. By the way, input paths (or lengths thereof) along which the pulse signal is transmitted from the pulse delay circuit to the pieces of pulse position numerizing means may be different from one another. In this case, numerical data items expressing the position of the pulse signal within the pulse delay circuit and being produced the respective pieces of pulse position numerizing means become uncertain. Numerical data representing a result of A/D conversion and being calculated based on the numerical data items may contain an error.

In order to realize the A/D conversion device of the eighteenth or twenty-seventh embodiment, a plurality of delay units constituting a pulse delay circuit is disposed along a straight line as it is in a fortieth or forty-first embodiment. Moreover, m pieces of pulse position numerizing means are divided into two groups. The pieces of pulse position numerizing means belonging to each group are arranged symmetrically to a straight line extending in a direction of disposition in which the delay units constituting the pulse delay circuit are disposed.

In this case, the lengths of the input paths along which a pulse signal is transmitted from the pulse delay circuit to the pieces of pulse position numerizing means are made uniform. Therefore, the timings of transmitting the pulse signal to the pieces of pulse position numerizing means can be identical with one another. Consequently, an error in an A/D result can be prevented from occurring due to the uncertainty in numerical data items that express the position of the pulse signal within the pulse delay circuit and that are produced by the pieces of pulse position numerizing means.

The A/D conversion device of the eighteenth or twenty-seventh embodiment changes a delay time, which is given by the delay units constituting the pulse delay circuit, according to an analog input signal. The changed delay time is numerically expressed based on the position of the pulse signal within the pulse delay circuit. The delay time to be given by the delay units changes with temperature or any other use environment. A result of A/D conversion (numerical data) produced by the A/D conversion device of the eighteenth or twenty-seventh embodiment may therefore vary with a change in the use environment.

In order to overcome the above problem, an input signal selecting means is included as it is in a forty-second or forty-third embodiment. Specifically, the input signal selecting means selects a signal, with which the delay time to be given by the delay units is changed, from an analog input signal and a reference signal whose voltage level is known, and applies the selected signal to the pulse delay circuit. When the contacts of the input signal selecting means are switched in order to apply the analog input signal to the pulse delay circuit, an uncorrected data holding means holds as uncorrected data numerical data produced by the adding means (in other words, a result of A/D conversion performed on the analog input signal). When the contacts of the input signal selecting means are switched in order to apply the reference signal to the pulse delay circuit, a reference data holding means holds as reference data the numerical data produced by the adding means (in other words, a result of A/D conversion performed on the reference signal). A dividing means divides the uncorrected data held in the uncorrected data holding means by the reference data held in the reference data holding means. Thus, corrected numerical data representing the analog input signal may be produced.

The embodiments of the present invention will be described in conjunction with the drawings described below.

BRIEF DESCRIPTION OF THE DRAWINGS

FIG. 1A and FIG. 1B are block diagrams showing the configuration of an A/D conversion device of a first example;

FIG. 2A and FIG. 2B are explanatory diagrams concerning actions to be performed in the A/D conversion device of the first example;

FIG. 14A and FIG. 14B are explanatory diagrams showing the configuration of an A/D conversion device of a fourth example and sampling clocks that are applied to respective pulse position numerizing units included in the fourth example;

FIG. 18 is an explanatory diagram concerning actions to be performed by the sampling clock generating circuit shown in FIG. 17A and FIG. 17B.

DESCRIPTION OF THE PREFERRED EMBODIMENTS

FIRST EXAMPLE

FIG. 1 is a block diagram showing an A/D conversion device of a first example in which the present invention (more particularly, any of the first to eighth embodiments of the present invention) is implemented.

As shown in FIG. 1A, the A/D conversion device of the first example comprises a pulse delay circuit 10, m pulse position numerizing units 12, and an adder 14. The pulse delay circuit 10 has a plurality of delay units 2, which delay and transmit a pulse signal, connected in series with one another. The m pulse position numerizing units 12 detect the number of delay units, through which a pulse signal passes within the pulse delay circuit 10, during one cycle of respective sampling clocks CK1 to CKm, which are externally cyclically applied, synchronously with the respective timings of the rising (or falling) edges of the associated sampling clocks CK1 to CKm. The m pulse position numerizing units 12 then transmit numerical data items DT1 to DTm expressing the results of the detection. The adder 14 summates the m numerical data items DT1 to DTm sent from the respective pulse position numerizing units 12 so as to produce numerical data DTA of $n+\log_2 m$ bits long.

Figure 1B:
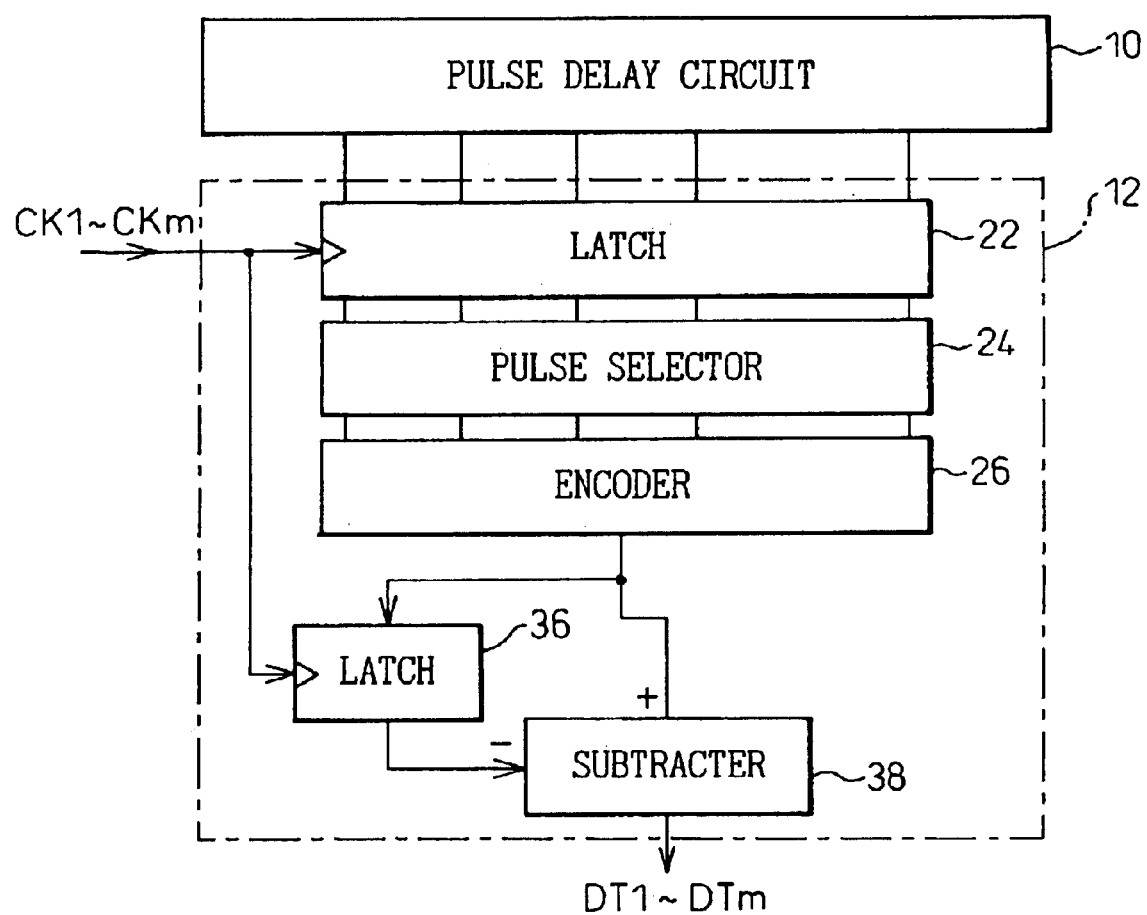

As shown in FIG. 1B, each of the m pulse position numerizing units 12 comprises a latch 22, a pulse selector 24, an encoder 26, a latch 36, and a subtractor 38. The latch 22 latches outputs of the delay units 22 included in the pulse delay circuit 10 synchronously with the timing of the rising (or falling) edge of an associated one of the sampling clocks CK1 to CKm. Based on the outputs of the delay units 22 latched by the latch 22, the pulse selector 24 detects the position of a delay unit 2, of which output has made a transition from a high level to a low level, in the pulse delay circuit (that is, a position in the pulse delay circuit the pulse signal has reached). The encoder 26 converts the result of the detection performed by the pulse selector 24 (the position in the pulse delay circuit the pulse signal has reached) into numerical data. The latch 36 latches an output of the encoder 26 at the timing of the rising (or falling) edge of the associated one of the sampling clocks CK1 to CKm. The subtractor 38 calculates a deviation of numerical data (new data) sent from the encoder 26 from numerical data (previous data) latched by the latch 36, and eventually transmits the deviation as any of numerical data items DT1 to DTm of n bits.

The delay units 2 constituting the pulse delay circuit 10 are realized with gate circuits each including inverters as described later (see FIG. 3). An analog input signal (voltage) Vin that is an object of A/D conversion is applied as a driving voltage to the delay units 2.

As shown in FIG. 2A, the period of the sampling clocks CK1 to CKm that are applied to the m respective pulse position numerizing units 12 is set to a certain time Ts. The time Ts is much longer than a delay time to be given by the delay units 2 (for example, several tens or more times longer than the delay time to be given by the delay units 2). Moreover, the period is determined so that a phase difference between adjoining ones of the sampling clocks CK1 to CKm will be a certain time ΔTs corresponding to a 1/m of the period.

For example, if the number of pulse position numerizing units 12 is four, four sampling clocks CK1 to CK4 are applied to the respective pulse position numerizing units 12. The period of the sampling clocks is determined so that phase differences between the sampling clock CK1 serving as a reference and the other sampling clocks CK2 to CK4 will be Ts/4, 2×Ts/4, and 3×Ts/4 respectively.

Moreover, the number of stages in which the delay units 2 are interconnected within the pulse delay circuit 10 is determined so that a pulse signal can be transferred for a period of time much longer than the period of the sampling clocks CK1 to CKm. This helps the pulse position numerizing units 10 perform numerical expression more than a predetermined number of times synchronously with the respective sampling clocks CK1 to CKm.

In the A/D conversion device of the first example having the foregoing components, a delay time to be given by each delay unit 2 changes with the signal level (voltage level) of the analog input signal Vin. The higher the signal level of the analog input signal Vin, the shorter the delay time.

A pulse signal PA is applied to the pulse delay circuit 10 and transferred within the pulse delay circuit 10. Meanwhile, the pulse position numerizing units 12 generate numerical data items DT1 to DTm synchronously with the respective sampling clocks CK1 to CKm. The numerical data items DT1 to DTm changes with the signal level of the analog input signal Vin. The higher the signal level of the analog input signal Vin, the larger the numerical data items DT1 to DTm. In other words, the pulse position numerizing units 12 can generate numerical data resulting from A/D conversion of the analog input signal Vin.

The pulse position numerizing units 12 are activated at the respective timings of the rising (or falling) edges of the associated sampling clocks CK1 to CKm. The numerical data items DT1 to DTm sent from the respective pulse position numerizing units 12 are therefore updated synchronously with the associated sampling clocks CK1 to CKm at different timings.

For example, when the number of pulse position numerizing units 12 is four, the numerical data items DT1 to DTm sent from the respective pulse position numerizing units 12 are, as shown in FIG. 2B, updated at timings t11, t12, t13, t14, t21, t22, etc. that are different from one another by a Ts/4.

The numerical data items DT1 to DTm are applied to the adder 14 and summated. Numerical data DTA generated as a result of A/D conversion by the adder 14 corresponds to an average of the numerical data items generated by the respective pulse position numerizing units 12 during a time Ts corresponding to one cycle of the sampling clocks CK1 to CKm. A voltage resolution expressed by the numerical data is higher by the number of bits ($\log_2 m$) added through the summation than a voltage resolution expressed by numerical data generated by one pulse position numerizing unit 12.

According to the A/D conversion device of the first example, unlike the conventional A/D conversion device including the pulse delay circuit 10 and one pulse position numerizing unit 12, a voltage resolution expressed by numerical data DTA generated as a result of A/D conversion can be improved without a decrease in the speed of A/D conversion. Moreover, as long as the voltage resolution expressed by the numerical data DTA need not be improved, the period of the sampling clocks CK1 to CKm can be shortened. Consequently, A/D conversion can be achieved at a higher speed than that by the conventional A/D conversion device.

A typical gate circuit can delay the pulse signal PA by a predetermined delay time and the delay time to be given by the gate circuit changes with a driving voltage. Therefore, any typical gate circuit can be used to form the delay units 2 constituting the pulse delay circuit 10. For simpler circuitry, each of the delay units 2 can be configured as shown in, for example, FIG. 3A.

Figure 3A:
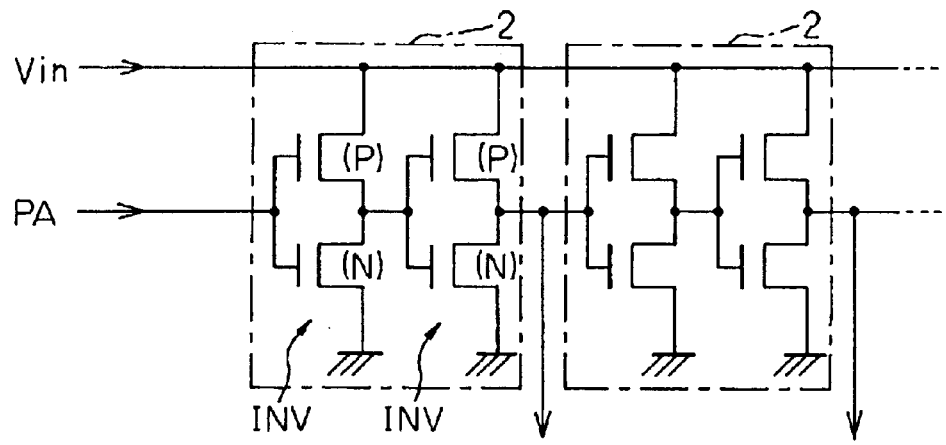
FIG. 3A to FIG. 3C are explanatory diagrams showing examples of the configuration of a delay unit.

Referring to FIG. 3A, each of the delay units 2 constituting the pulse delay circuit 10 includes two stages of CMOS inverters INV each composed of a p-channel (field-effect) transistor and an n-channel (field-effect) transistor. An input pulse is delayed by a predetermined time determined with the operation times of the p-channel transistor and n-channel transistor constituting each of the preceding and succeeding CMOS inverters INV. When each delay unit 2 is configured this way, it means that the delay unit 2 can be realized with four transistors. The transistors can be manufactured very easily in the process of manufacturing a CMOS integrated circuit. Consequently, the pulse delay circuit 10 can be realized inexpensively.

Figure 3B:
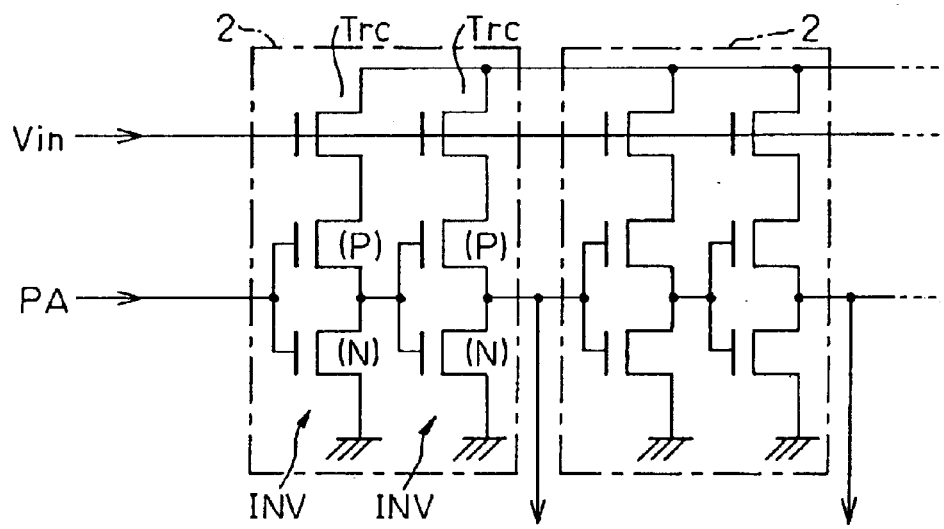

As described above, the analog input signal Vin is applied as a driving voltage to the delay units 2 in order to control the delay time to be given by the delay units 2 according to the signal level of the analog input signal Vin. However, a control (field-effect) transistor Trc for controlling a driving current externally may, as shown in FIG. 3B, be added to each of the CMOS inverters INV included in each delay unit 2. In this case, the analog input signal Vin may be applied as a control signal to a control terminal (gate) of the control transistor.

Specifically, the operation time of the gate circuit such as the inverter INV varies depending on a driving current supplied from a dc power supply. Therefore, even if the driving current is, as shown in FIG. 3B, controlled based on the analog input signal Vin, an A/D conversion device capable of providing the same advantages as the aforesaid ones can be realized.

Figure 3C:
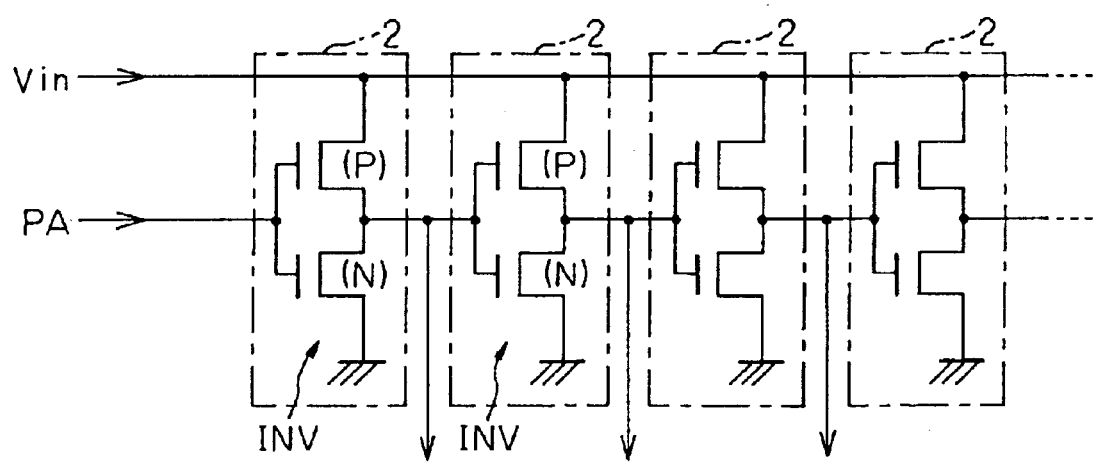

Moreover, each of the delay units 2 constituting the pulse delay circuit 10 need not include two inverters INV. As shown in FIG. 3C, each delay unit may include one stage of a CMOS inverter INV composed of a p-channel (field-effect) transistor and an n-channel (field-effect) transistor.

A case where each delay unit 2 is realized with one stage of a CMOS inverter INV will be discussed. When the pulse signal PA is applied to the pulse delay circuit 10 and an input terminal level of the pulse delay circuit 10 for the pulse signal PA changes from a low level to a high level, outputs of the delay units 2 of odd-numbered stages, counted from the one nearest the input terminal of the pulse signal PA, included in the pulse delay circuit 10 are successively driven from high to low. Outputs of the delay units 2 of evennumbered stages are successively driven from low to high. Consequently, the pulse selector 24 included in each pulse position numerizing unit 12 is designed to detect a position within the pulse delay circuit 10 at which outputs of adjoining delay units have the same level each other. The position is detected as a position which the pulsating signal PA has reached.

As mentioned above, when each of the delay units 2 is realized with one stage of a CMOS inverter INV, a delay time to be given by the delay units 2 is shorter (nearly half) than that attained when each delay unit 2 is composed of two stages of CMOS inverters INV. Consequently, A/D conversion can be achieved at a higher speed. However, the delay time to be given by the CMOS inverter INV and measured as a period from the rising edge of an input pulse to the falling edge of an output pulse is different from a delay time to be given thereby and measured as a period from the falling edge of the input pulse to the rising edge of the output pulse. Therefore, a result of A/D conversion may become uncertain.

From this viewpoint, the A/D conversion device in which each of the delay units 2 constituting the pulse delay circuit 10 is realized with one stage of a CMOS inverter INV should be adapted to a system required to achieve A/D conversion at a higher speed.

On the other hand, the adder 14 may be activated synchronously with one of the m sampling clocks CK1 to CKm or synchronously with the respective timings of the rising (or falling) edges of the m sampling clocks CK1 to CKm.

In particular, if the adder 14 is activated synchronously with the respective timings of the rising (or falling) edges of the m sampling clocks CK1 to CKm, every time one of the m pulse position numerizing units 12 updates numerical data DT1, the numerical data DTA transmitted from the A/D conversion device is updated. The period of A/D conversion is equal to the period of the sampling clocks CK1 to CKm (that is, Ts/m). The A/D conversion device will therefore prove effective when adapted to a system required to achieve A/D conversion at a higher speed.

Moreover, in this example, the sampling clocks CK1 to CKm, that vary cyclically, are applied to the pulse position numerizing units 12. After the pulse signal PS is applied to the pulse delay circuit 10, when a predetermined time has elapsed, the sampling clocks CK1 to CKm for use in numerically expressing the position of a pulse may be separately applied to the associated pulse position numerizing units 12 at different timings. The adder 14 may then summate numerical data items produced by the encoders 26 included in the pulse position numerizing units 12 (more particularly, numerical data items expressing the positions of a pulse signal within the pulse delay circuit 10). Thus, the numerical data DTA representing the analog input signal (a result of A/D conversion) may be generated.

In the present example, the pulse position numerizing units 12 correspond to the pieces of pulse position numerizing means included in the present invention (especially in the eighteenth to twenty-fifth embodiments). The adder 14 corresponds to the adding means included in the present invention (especially in the eighteenth to twenty-fifth embodiments).

SECOND EXAMPLE

Figure 4:
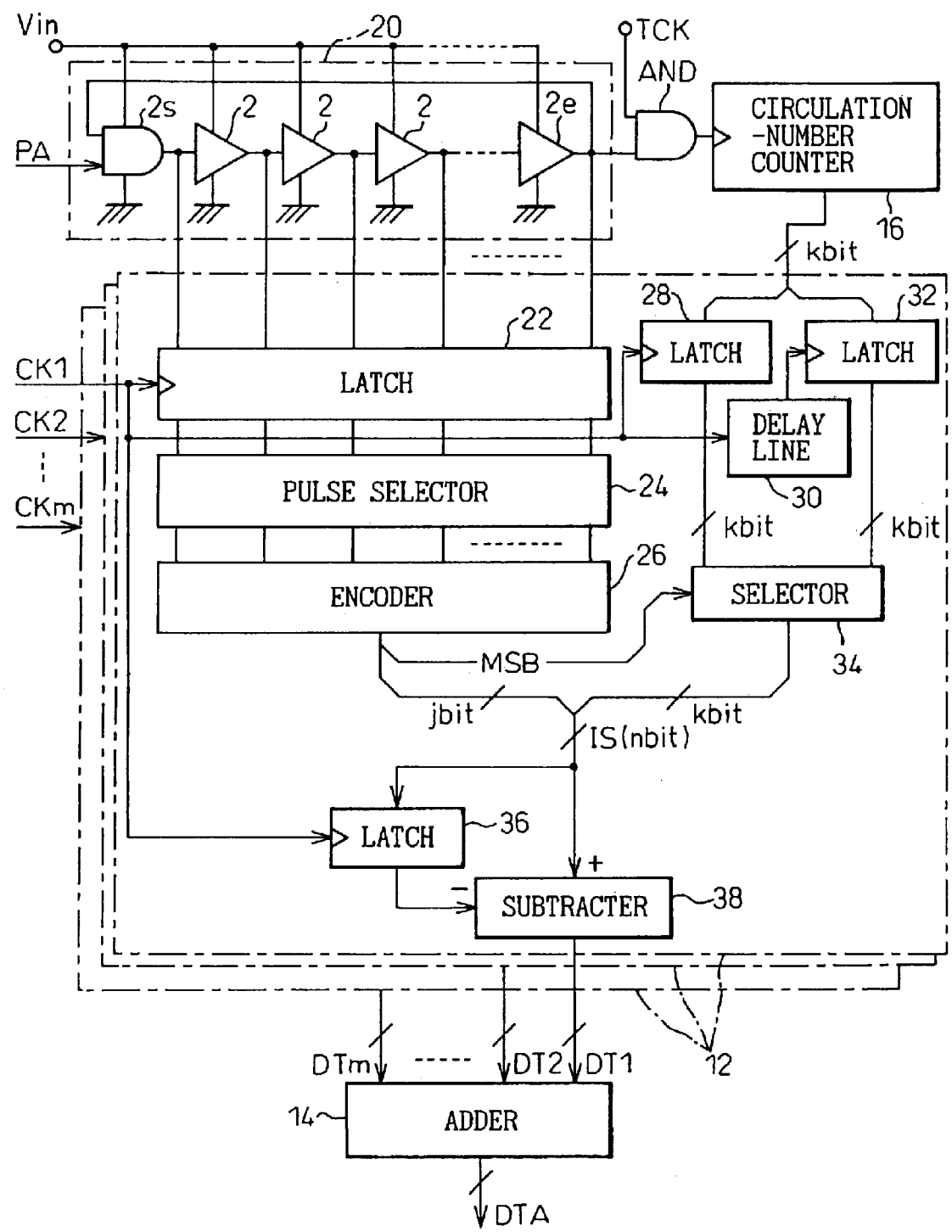
FIG. 4 is a block diagram showing the configuration of an A/D conversion device of a second example.
Figure 5:
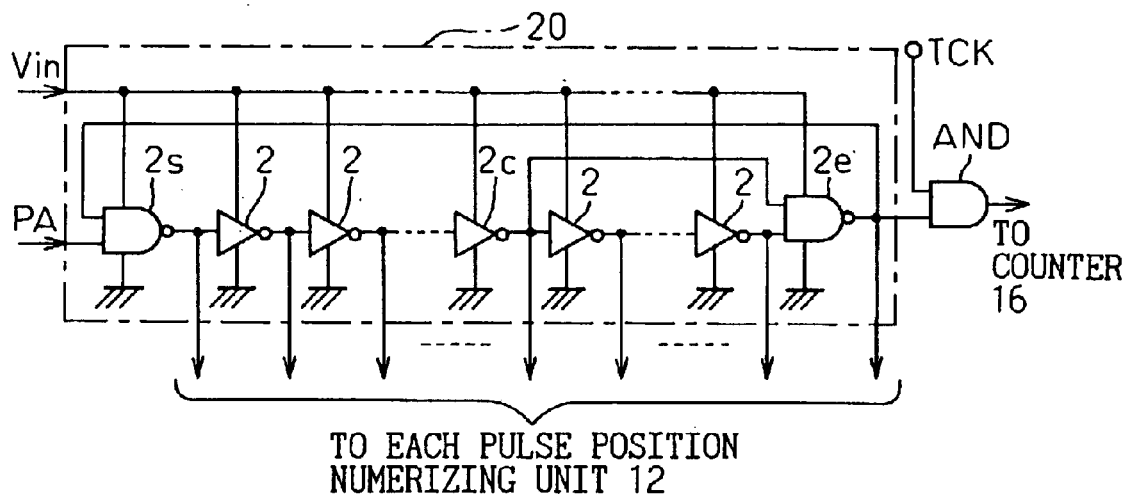
FIG. 5 is an explanatory diagram showing an example of the configuration of a pulse circulation circuit 20.

Next, FIG. 4 is a block diagram showing the configuration of an A/D conversion device of a second example to which the present invention (or more particularly, any of the first to tenth embodiments) is adapted.

The A/D conversion device of the second example shown in FIG. 4 includes a pulse circulation circuit 20 instead of the pulse delay circuit 10 included in the first example. The pulse circulation circuit 20 has delay units 2 concatenated annularly so that a pulse signal PA can be returned from a delay unit 2e of a final stage to a delay unit 2s of an initial stage for the purpose of circulating the pulsating signal. An output of the delay unit 2s of the final stage in the pulse circulation circuit 20 is applied to a circulation-number counter 16 via an AND circuit AND. The circulation-number counter 16 then counts the number of times by which the pulse signal has circulated through the pulse circulation circuit 20.

The A/D conversion device of the second example includes, similarly to the one of the first example, m pulse position numerizing units 12 that detect the circulative position of a pulse signal within the pulse circulation circuit 20 synchronously with associated sampling clocks CK1 to CKm. An adder 14 is included for summating m numerical data items DT1 to DTm generated by the m respective pulse position numerizing units 12.

In the pulse circulation circuit 20, the delay units 2s and 2e of the initial and final stages are realized with NAND circuits, and the other delay units 2 (an even number of delay units) are realized with inverters. An output of a delay unit 2c of a middle stage jumps over plurality of stages of delay units 2 and applied to an input terminal, which is not concatenated annularly, in the delay unit 2e of the final stage. Thus, when a pulse signal PA (high level) for activation is applied to one input terminal of the delay unit 2s of the initial stage, the output levels of the delay units starting with the delay unit 2s of the initial stage are sequentially driven to low, high, low, high, etc. The output level of the delay unit 2e of the final stage is forcibly inverted with a change in an output of the delay unit 2c of the middle stage (a high-to-low transition immediately after activation). Thus, the pulse signal can be circulated. In the present example, an analog input signal Vin that is an object of A/D conversion is applied as power to be supplied to the delay units 2 included in the pulse circulation circuit 20.

As the pulse circulation circuit 20 is already known, a description thereof will be omitted (refer to, for example, Japanese Unexamined Patent Application Publications Nos. 6-216721, 9-218281, and 10-54887).

On the other hand, the pulse position numerizing units 12 included in the present example are, similarly to the pulse position numerizing units 12 included in the first example, activated synchronously with the associated respective sampling clocks CK (sampling clocks CK1 to CKm). Each of the pulse position numerizing units 12 includes a latch 22, a pulse selector 24, and an encoder 26 for the purpose of detecting the position within the pulse circulation circuit 20 which a pulsating signal has reached.

Moreover, each of the pulse position numerizing units 12 included in the present example includes a latch 28, a latch 32, and a selector 34. The latch 28 latches an output of the circulation-number counter 16 at the timing of the rising (or falling) edge of an associated sampling clock CK. The latch 32 receives the sampling clock CK via a delay line 30, which gives a delay time shorter (about half) than the cycle of the sampling clock CK, and latches an output (k bits long) of the circulation-number counter 16 at the timing of the rising (or falling) edge of the sampling clock CK. If the most-significant bit of numerical data (of j bit long) generated by the encoder 26 is low, the selector 34 selects an output of the latch 28. If the bit is high, the selector 34 selects an output of the latch 32. Each pulse position numerizing unit 12 produces numerical data IS of n bits long having the output of the encoder 26 (of j bits long) as low-order bit data and the output of the selector 34 (of k bits long) as high-order bit data.

Moreover, each of the pulse position numerizing units 12 included in the present example includes a latch 36 and a subtractor 38. The latch 36 latches the numerical data IS of n bits long, which is generated as mentioned above, at the timing of the rising (or falling) edge of the sampling clock CK. The subtractor 38 calculates a deviation of the numerical data IS (new data) composed of the outputs of the encoder 26 and selector 34 from numerical data IS (previous data) latched by the latch circuit 36, and transmits the deviation as final numerical data DT (any of DT1 to DTm).

Figure 6:
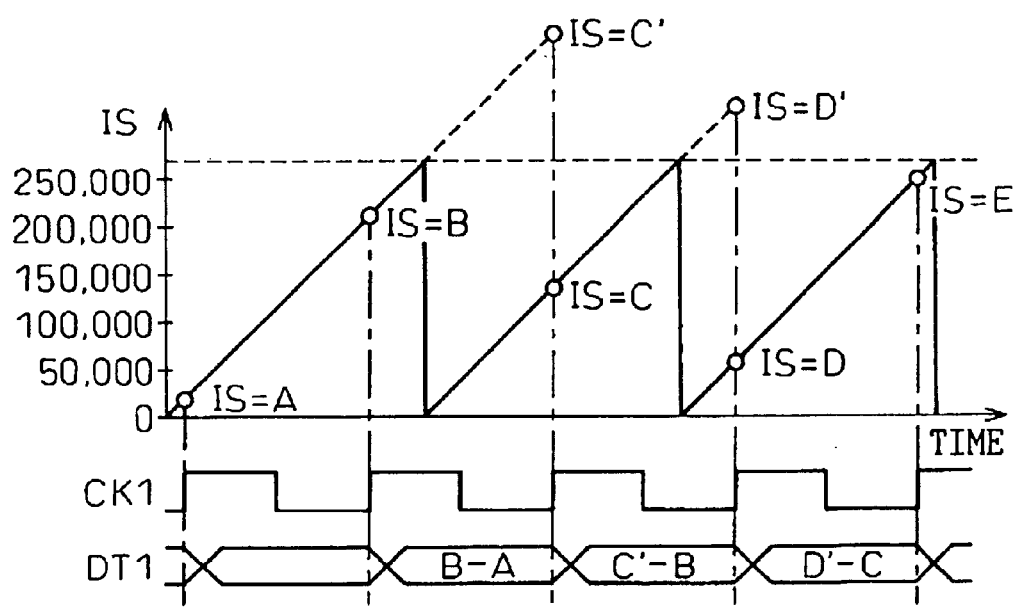
FIG. 6 is an explanatory diagram concerning actions to be performed in the A/D conversion device of the second example.

As shown in FIG. 6, when the new numerical data IS composed of the outputs of the encoder 26 and selector 34 is larger than the previous numerical data IS latched by the latch 36, the subtractor 38 subtracts the previous numerical data IS (for example, A in FIG. 6) from the new numerical data IS (for example, B in FIG. 6) so as to calculate numerical data DT (any of DT1 to DTm). If the new numerical data IS is smaller than the previous numerical data IS, numerical data IS (for example, C' in FIG. 6) is calculated by adding high-order bit data, which corresponds to a maximum count value the circulation-number counter 16 can provide, to the new numerical data IS (for example, C in FIG. 6). The previous numerical data IS (for example, B in FIG. 6) is then subtracted from the resultant numerical data IS, whereby the numerical data DT (any of DT1 to DTm) is produced.

If the circulation-number counter 16 overflows, the circulation-number counter 16 restarts counting from 0. Nevertheless, using the newly produced numerical data IS and the previous numerical data IS latched by the latch 36, the number of delay units 2 through which a pulse signal has passed within the pulse circulation circuit 20 can be counted during one period of the sampling clock CK (any of CK1 to CKm).

The pulse position numerizing units 12 are already known. The description of the pulse position numerizing units will therefore be omitted (refer to the aforesaid patent application publications).

In the present example, the period of the sampling clocks CK is set to a time equal to or shorter than the time from the instant the pulse signal PA is applied to the pulse circulation circuit 20 to the instant the circulation-number counter 16 overflows. This helps the subtractors 38 accurately calculate numerical data items DT (DT1 to DTm).

In the present example, the latch circuit 22, pulse selector 24, and encoder 26 included in each of the pulse position numerizing units 12 act as the pulse position detecting circuit included in the twentieth embodiment. The latch 36 and subtractor 38 act as the arithmetic circuit included in the twentieth embodiment.

The AND circuit AND located on a pulsating signal input path along which a pulse signal is transmitted from the pulse circulation circuit 20 to the circulation-number counter 16 corresponds to the input circuit included in the twenty-first embodiment. When an input terminal of the AND circuit that is not connected to the delay unit 2e of the final stage in the pulse circulation circuit 20 is high, an output of the delay unit 2e is applied to the circulation-number counter 16. The counting action of the circulation-number counter 16 is thus enabled. In contrast, when the output of the delay unit 2e of the final stage is low with the circulating action of the pulse circulation circuit 20 stopped, a test clock TCK for use in testing the counter is applied to the input terminal of the AND circuit that is not connected to the delay unit 2e of the final stage. Thus, the counting action of the circulation-number counter 16 can be tested.

In the A/D conversion device of the present example having the foregoing components, similarly to the A/D conversion device of the first example, the m pulse position numerizing units 12 numerically express the number of delay units 2, through which a pulse signal has passed within the pulse circulation circuit 20, during one period of the associated sampling clocks CK1 to CKm, synchronously with the associated sampling clocks CK1 to CKm. The adder 14 summates the resultant numerical data items DT1 to DTm, whereby numerical data DTA that is a result of A/D conversion is generated.

Even the A/D conversion device of the present example can provide the same advantages as the A/D conversion device of the first example. Moreover, according to the A/D conversion device of the present example, the pulse circulation circuit 20 is substituted for the pulse delay circuit 10 included in the first example. The circulation-number counter 16 is used to count the number of times by which a pulse signal circulates through the pulse circulation circuit 20. The number of delay units 2 through which the pulse signal has passed during one cycle of the sampling clocks CK1 to CKm is then numerically expressed. Consequently, the number of delay units 2 constituting the pulse circulation circuit 20 may be made much smaller than that in the pulse delay circuit 10 included in the first example. Eventually, the scale of circuitry can be diminished, and the device can be designed to be compact and inexpensive.

Next, a description will be made of the arrangement on an IC substrate of the components of the A/D conversion device of the present example when the A/D conversion device is realized with ICs.

To begin with, the A/D conversion device of the present example includes the plurality of pulse position numerizing units 12 which detects the position of a pulsating signal within the pulse circulation circuit 20. If pulse signal input paths (especially the lengths of the paths) extending from the pulse circulation circuit 20 to the pulse position numerizing units 12 are different from one another, numerical data items DT1 to DTm produced by the pulse position numerizing units 12 become uncertain. Eventually, a result of A/D conversion may contain an error.

Figure 7:
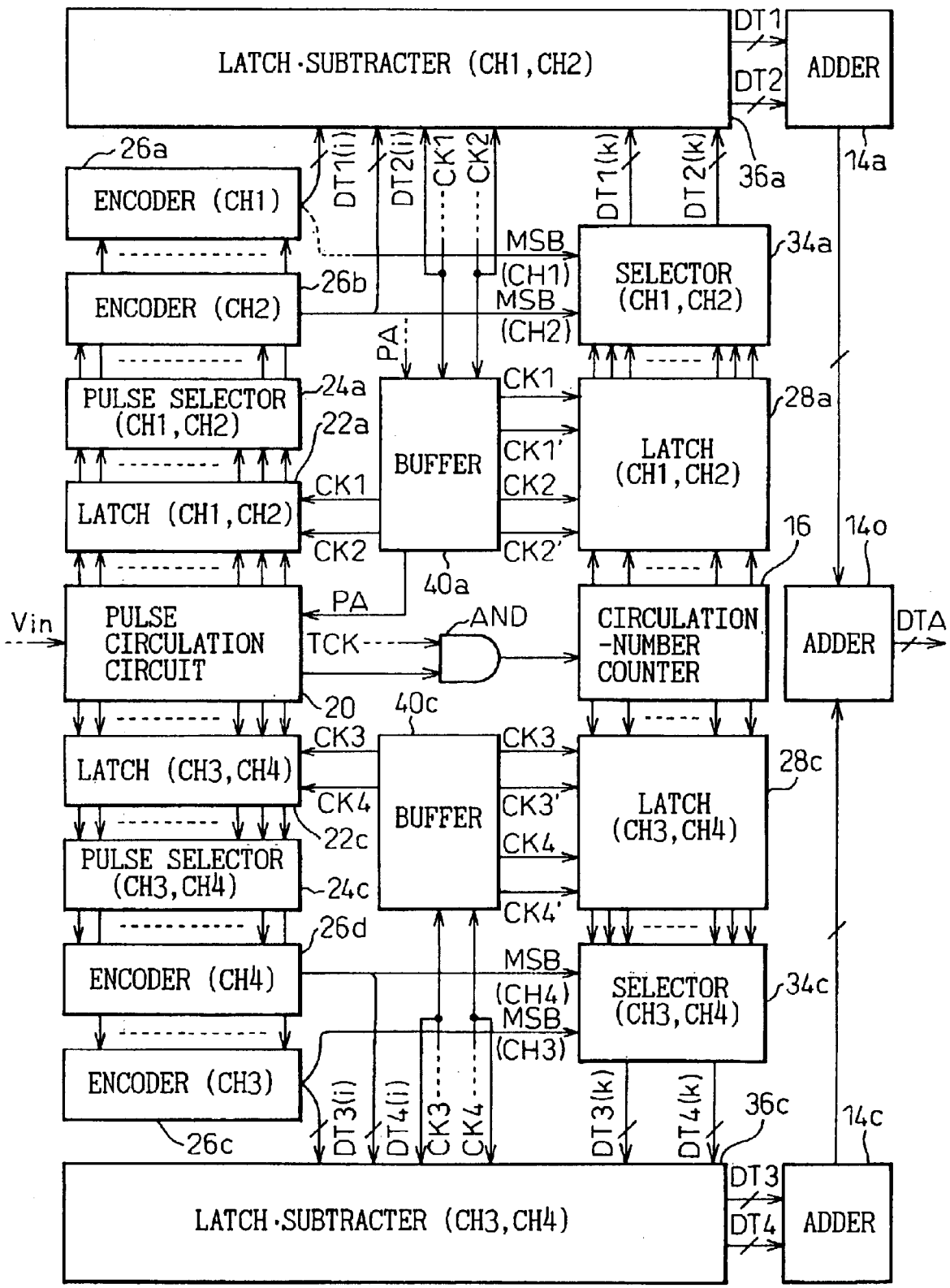
FIG. 7 is an explanatory diagram showing an example of arrangement of components when the A/D conversion device of the second example is realized with ICs.

When the A/D conversion device of the present invention is realized with ICs, the pulse circulation circuit 20 and circulation-number counter 16 are first, as shown in FIG. 7, arranged in the center of a substrate. An AND circuit AND is arranged between the pulse circulation circuit 20 and the circulation-number counter 16. The delay units 2 constituting the pulse circulation circuit 20 are disposed in a row (along a straight line) in the direction of arrangement in which the pulse circulation circuit 20 and circulation-number counter 16 are arranged. Output lines extending from the delay units 2 are led out in two directions (upward and downward directions in FIG. 7) via a wiring pattern formed orthogonally to the direction of which the delay units 2 are disposed. The pulse position numerizing units 12 belonging to each of two groups into which the m pulse position numerizing units 12 are divided are arranged symmetrically to a straight line drawn along the direction which the delay units are disposed, by the sides of the output lines.

Specifically, when the A/D conversion device includes four pulse position numerizing units 12 associated with channels CH1 to CH4, a latch 22a serving as the latches 22 included in the pulse position numerizing units 12 associated with channels CH1 and CH2, and a latch 22c serving as the latches 22 included in the pulse position numerizing units 12 associated with channels CH3 and CH4 are arranged on both the sides of the pulse circulation circuit 20. A pulse selector 24a serving as the two pulse selectors 24 included in the pulse position numerizing units 12 associated with channels CH1 and CH2, and a pulse selector 24c serving as the two pulse selectors 24 included in the pulse position numerizing units 12 associated with channels CH3 and CH4 are arranged externally to the respective latches 22. Furthermore, encoders 26a and 26b and encoders 26c and 26d, which serve as the encoders 26 included in the pulse position numerizing units 12 associated with the channels, are arranged externally to the pulse selectors.

A latch 28a serving as the latches 28 and 32 included in the pulse position numerizing units 12 associated with channels CH1 and CH2, and a latch 28c serving as the latches 28 and 32 included in the pulse position numerizing units 12 associated with channels CH3 and CH4 are arranged on both the sides of the circulation-number counter 16. This is because the latches 28a and 28c latch an output of the circulation-number counter 16. Furthermore, a selector 34a serving as the selectors 34 included in the pulse position numerizing units 12 associated with channels CH1 and CH2, and a selector 34c serving as the selectors 34 included in the pulse position numerizing units 12 associated with channels CH3 and CH4 are arranged externally to the latches.

The encoders 26a and 26c are arranged most externally with the pulse circulation circuit 20 as a center. The selectors 34a and 34c are arranged in outermost places with the circulation-number counter 16 as a center. The encoders 26a and 26c and the selectors 34a and 34c are sandwiched between latch subtractors 36a and 36c serving as the latches 36 and subtractors 38 included in the pulse position numerizing units 12 associated with channels CH1 and CH2 and with channels CH3 and CH4 respectively.

Adders 14a and 14c located near the latch subtractors summate outputs of the respective latch subtractors 36a and 36c (numerical data items DT1 and DT2 on channels CH1 and CH2 or numerical data items DT3 and DT4 on channels CH3 and CH4). An adder 14o summates the results of the addition performed by the adders 14a and 14c. An output of the adder 14o (numerical data DTA representing a result of A/D conversion) is transmitted to another circuit that is not shown.

The pulse signal PA for activation must be applied to the pulse circulation circuit 20. The sampling clocks CK1 to CK4 must be applied to the latches 22a, 22c, 28a, and 28c. Furthermore, clocks CK1' to CK4' that lag behind the sampling clocks CK1 to CK4 must be applied to the latches 28a and 28c. Circuits for applying the activation pulse signal PA and sampling clocks CK1 to CK4 and CK1' to CK4' to the respective components, that is, the delay lines 30 (delay lines DL1 and DL2 in FIG. 8) and buffers (buffers BF1 to BF6 in FIG. 8) which are included in the respective pulse position numerizing units 12 are disposed as buffers 40a and 40c between the latches 22a and 28b or between the latches 22c and 28c.

As mentioned above, when the A/D conversion device of the present example is realized with ICs, the pulse circulation circuit 20 and circulation-number counter 16 are arranged along a straight line. The pulse position numerizing units 12 divided into two groups are arranged symmetrically to the straight line extending in the direction of arrangement in which the pulse circulation circuit 20 and circulation-number counter 16 are arranged. The lengths of the pulsating signal input paths extending from the pulse circulation circuit 20 to the pulse position numerizing units 12 thus become uniform. Consequently, the timings that a pulse signal is applied to the pulse position numerizing units 12 agree with one another. Thus, a result of A/D conversion is prevented from suffering an error because of the uncertainty in the characteristics of the pulse position numerizing units 12 concerning numerical expression.

However, the uncertainty in the numerical expression characteristics of the pulse position numerizing units 12 is attributable to the fact that a pulse signal is delayed while being transmitted over the lines extending from the pulse circulation circuit 20 to the latches 22 included in the pulse position numerizing units 12. In order to realize the A/D conversion device with ICs, the lengths and widths of the lines must be made uniform but any of the components of the pulse position numerizing units 12 need not always be arranged symmetrically on the straight line.

Figure 8:
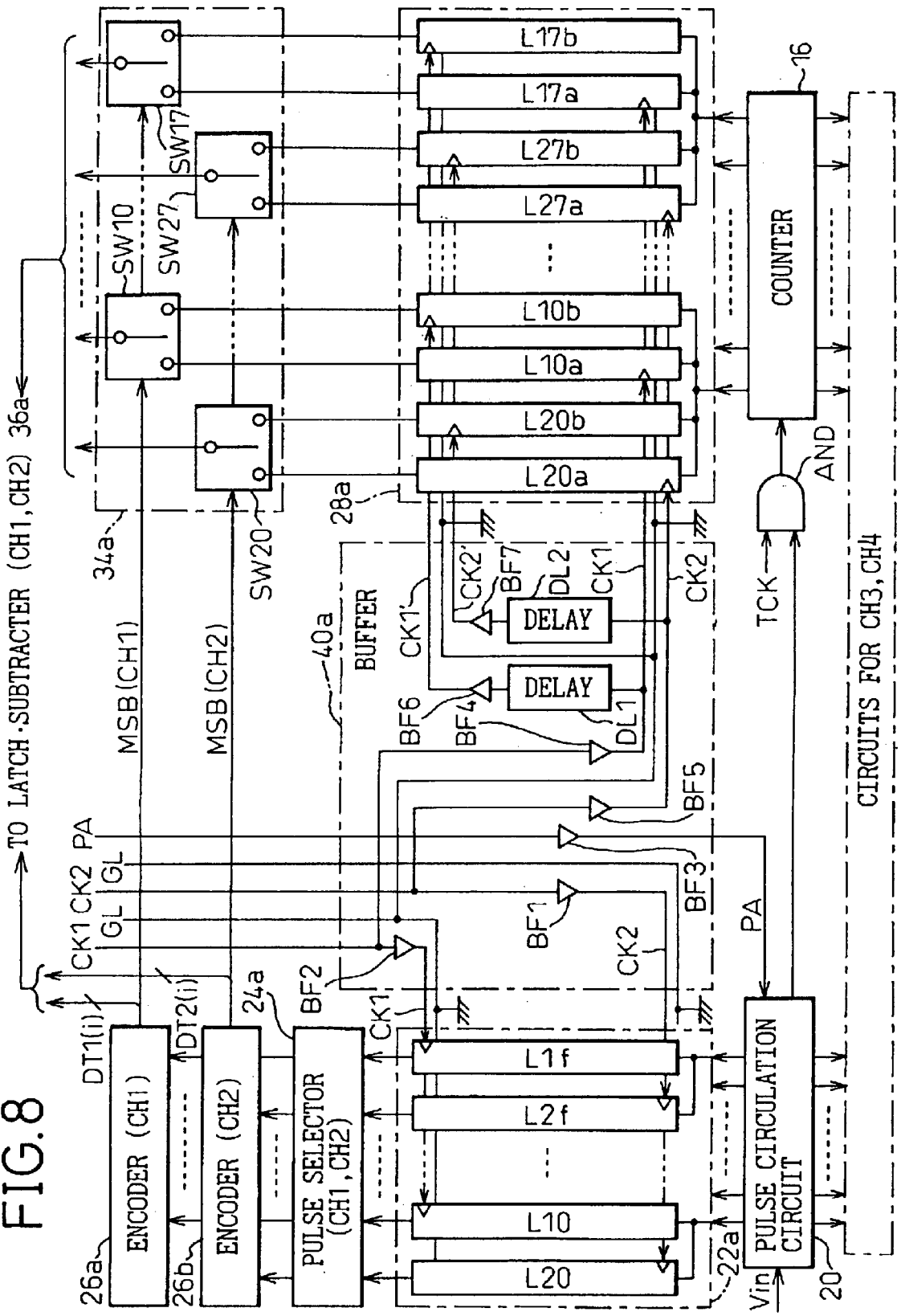
FIG. 8 is an explanatory diagram showing the detailed configurations of a latch circuit, a buffer, and a selector shown in FIG. 7.

As mentioned above, the lines, over which a pulse signal is transmitted from the pulse circulation circuit 20 to the latches 22 in the pulse position numerizing units 12, must be made uniform. For this purpose, the latches included in the latch 22a (or 22c) are arranged, for example, as shown in FIG. 8. Specifically, one of latch circuits L10 to L1f constituting the latch 22 included in the pulse position numerizing unit 12 associated with channel CH1 (or channel CH3) and one of latch circuits L20 to L2f constituting the latch 22 included in the pulse position numerizing unit 12 associated with channel CH2 (or CH4) are arranged alternately along the pulse signal lines over which a pulse signal is transmitted.

FIG. 8 is an explanatory diagram showing in details the latch 22a, buffer 40a, latch 28a, and selector 34a shown in FIG. 7.

As shown in FIG. 8, the latch 28a shown in FIG. 7 includes latch circuits L10a to L17a, latch circuits L10b to L17b, latch circuits L20a to L27a, and latch circuits L20b to L27b which constitute the latches 28 and 32 included in the respective pulse position numerizing units 12 associated with channels CH1 and CH2. One of the latch circuits L10a to L17a, one of the latch circuits L10b to L17b, one of the latch circuits L20a to L27a, and one of the latch circuits L20b to L27b are arranged alternately along bit data lines led out from the circuit-number counter 16. The selector 34a includes switches SW10 to SW17 used to select any of the outputs of the latch circuits L10a to L17a and L10b to L17b, and switches SW20 to SW27 used to select any of the outputs of the latch circuits L20a to L27a and L20b to L27b.

THIRD EXAMPLE

Figure 9:
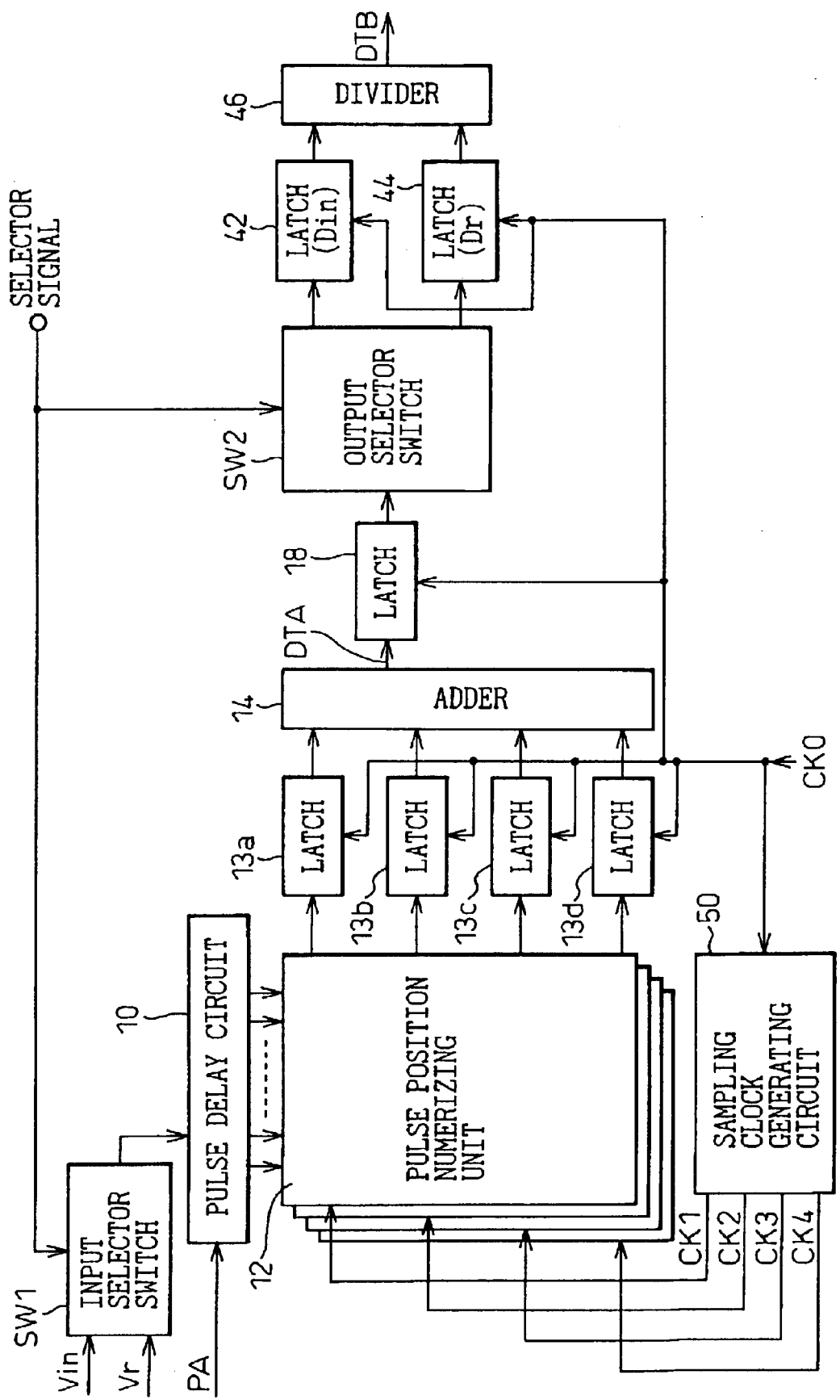
FIG. 9 is a block diagram showing the configuration of an A/D conversion device of a third example.

FIG. 9 is a block diagram showing the configuration of an A/D conversion device of a third example to which the present invention (more particularly, any of the first to tenth embodiments of the present invention) is adapted.

The A/D conversion device of the present example has the same components as the A/D conversion device of the first example and can achieve A/D conversion with higher precision. The A/D conversion device has a pulse delay circuit 10, four pulse position numerizing units 12, and an adder 14 which have the same configurations as those included in the A/D conversion device of the first example.

Latches 13a to 13d that latch numerical data synchronously with a reference clock CK0, which is applied externally for A/D conversion, are located on input paths along which numerical data is transmitted from the pulse position numerizing units 12 to the adder. Sampling clocks CK1 to CK4 are transmitted to the respective pulse position numerizing units 12 via a sampling clock generating circuit 50. The sampling clock generating circuit 50 generates shift clocks (that is, sampling clocks CK1 to CK4), which have a phase difference of one period of the reference clock CK0, by calculating a quarter of the frequency of the reference clock.

Figure 10:
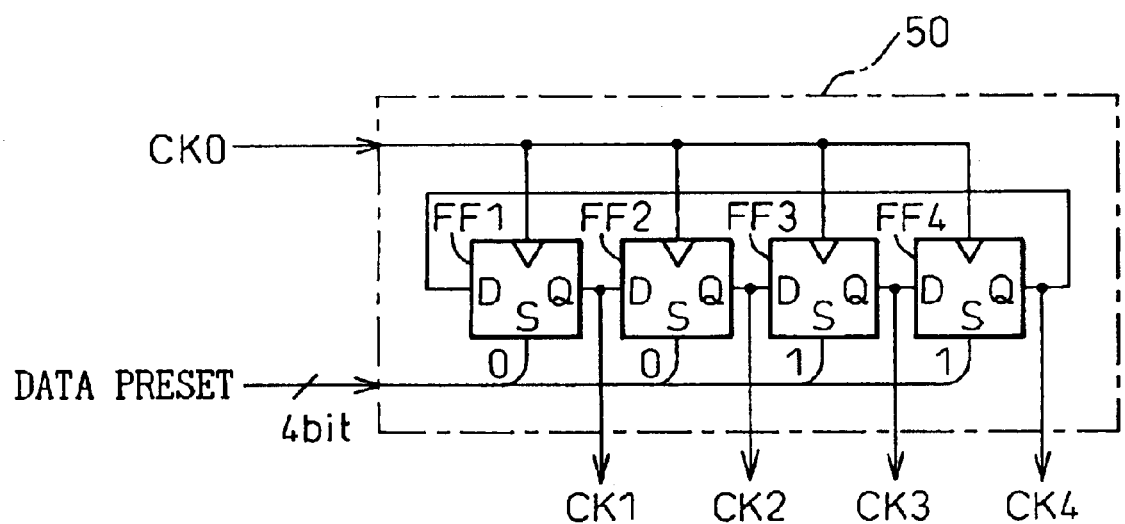
FIG. 10 is an explanatory diagram showing the configuration of a sampling clock generating circuit.

The sampling clock generating circuit 50 is, for example, as shown in FIG. 10, composed of shift registers that are realized with four flip-flops FF1 to FF4 connected to form a loop. Outputs of the flip-flops FF1 to FF4 are transmitted as four shift clocks (that is, the sampling clocks CK1 to CK4).

In other words, four bits constituting four-bit data 0011 are pre-set in the respective flip-flops FF1 to FF4. The bits are successively shifted at the timing of the rising (or falling) edge of the reference clock CK0. Consequently, four shift clocks that have a quarter of the frequency of the reference clock CK0, and a phase difference of one period of the reference clock CK0 are transmitted as the sampling clocks CK1 to CK4.

Figure 11:
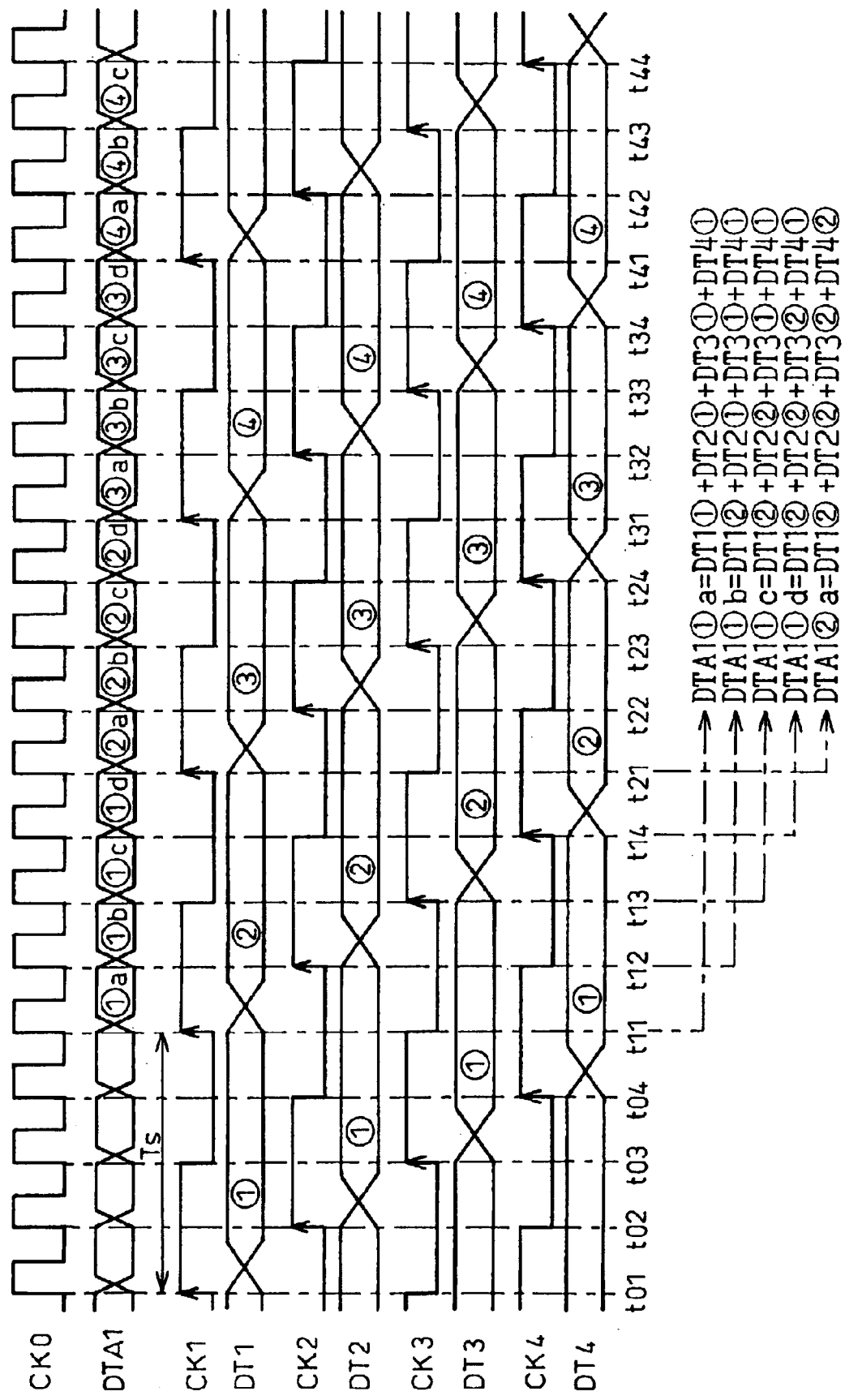
FIG. 11 is an explanatory diagram concerning actions to be performed in the A/D conversion device of the third example.

Consequently, as shown in FIG. 11, numerical data items DT1 to DT4 transmitted from the respective pulse position numerizing units 12 are updated every fourth cycle of the reference clock CK0. Every time any of the pulse position numerizing units 12 updates any of the numerical data items DT1 to DT4, the numerical data items DT1 to DT4 are latched. The adder 14 generates the latest result of A/D conversion (numerical data DTA) synchronously with the reference clock CK0.

Thereafter, either of an analog input voltage Vin that is an object of A/D conversion and a reference signal Vr of a constant voltage is selectively applied to the pulse delay circuit 10 via an input selector switch SW1. The pulse delay circuit 10 operates using the input signal (Vin or Vr) as a supply voltage.

Moreover, a latch 18 that latches the numerical data DTA synchronously with the reference clock CK0 is located on an output path along which the numerical data DTA is transmitted from the adder 14. Furthermore, an output selector switch SW2 that transmits the numerical data DTA latched by the latch circuit 18 selectively to either of two latch circuits 42 and 44 of succeeding stages.

The contacts of the output selector switch SW2 and the contacts of the input selector switch SW1 are switched simultaneously in response to an externally applied selector signal. When the input selector switch SW1 selects the analog input signal Vin, the output selector switch SW2 transmits the numerical data DTA (in other words, a result of A/D conversion performed on the analog input signal Vin), which is latched by the latch 18, to the latch 42. When the input selector switch SW1 selects the reference signal Vr, the output selector switch SW2 transmits the numerical data DTA (in other words, a result of A/D conversion performed on the reference signal Vr), which is latched by the latch 18, to the latch 44.

The numerical data items DTA latched by the respective latches 42 and 44 are applied to a divider 46. The divider 46 divides the numerical data Din sent from the latch 42 (result of A/D conversion performed on the analog input signal Vin) by the numerical data Dr (result of A/D conversion performed on the reference signal Vr) sent from the latch 44.

In the A/D conversion device of the present example, the reference signal Vr is A/D-converted in response to an externally applied selector signal. After numerical data that is the result of the A/D conversion is latched by the latch 44, the selector signal is inverted so that an analog input signal Vin will be A/D-converted. The divider 46 divides (corrects) the numerical data Din, which is the result of A/D conversion performed on the analog input signal Vin, by the numerical data Dr, and transmits the resultant data.

According to the A/D conversion device of the present example, even if a result of A/D conversion performed on the analog input signal Vin (numerical data DTA=Din) varies with a change in a use environment such as temperature, the numerical data DTB generated by correcting the numerical data DTA using a result of A/D conversion performed on the reference signal Vr can be transmitted from the divider 46. The resultant numerical data DTB is therefore a stable result of A/D conversion unaffected by the change in an environment such as temperature. In the present example, the input selector switch SW1 is equivalent to the input signal selecting means included in the embodiments 39 and 40. The latch 42 is equivalent to the uncollected data holding means included in the embodiments 39 and 40. The latch 44 is equivalent to the reference data holding means included in the embodiments 39 and 40. The divider 46 is equivalent to the dividing means included in the embodiments 39 and 40.

Herein, in the present example, the sampling clock generating circuit 50 is realized with a frequency division circuit including shift registers. This is intended to produce sampling clocks CK1 to CK4 that are shift clocks whose period is four times longer than the period of the reference clock CK0 with which the period of A/D conversion is determined. Moreover, a phase difference between adjoining ones of the shift clocks equals one period of the reference clock. However, in order to produce the other sampling clocks CK2 to CK4 on the basis of, for example, the externally applied sampling clock CK1, the sampling clock generating circuit 50 may be configured as shown in FIG. 12.

Figure 12:
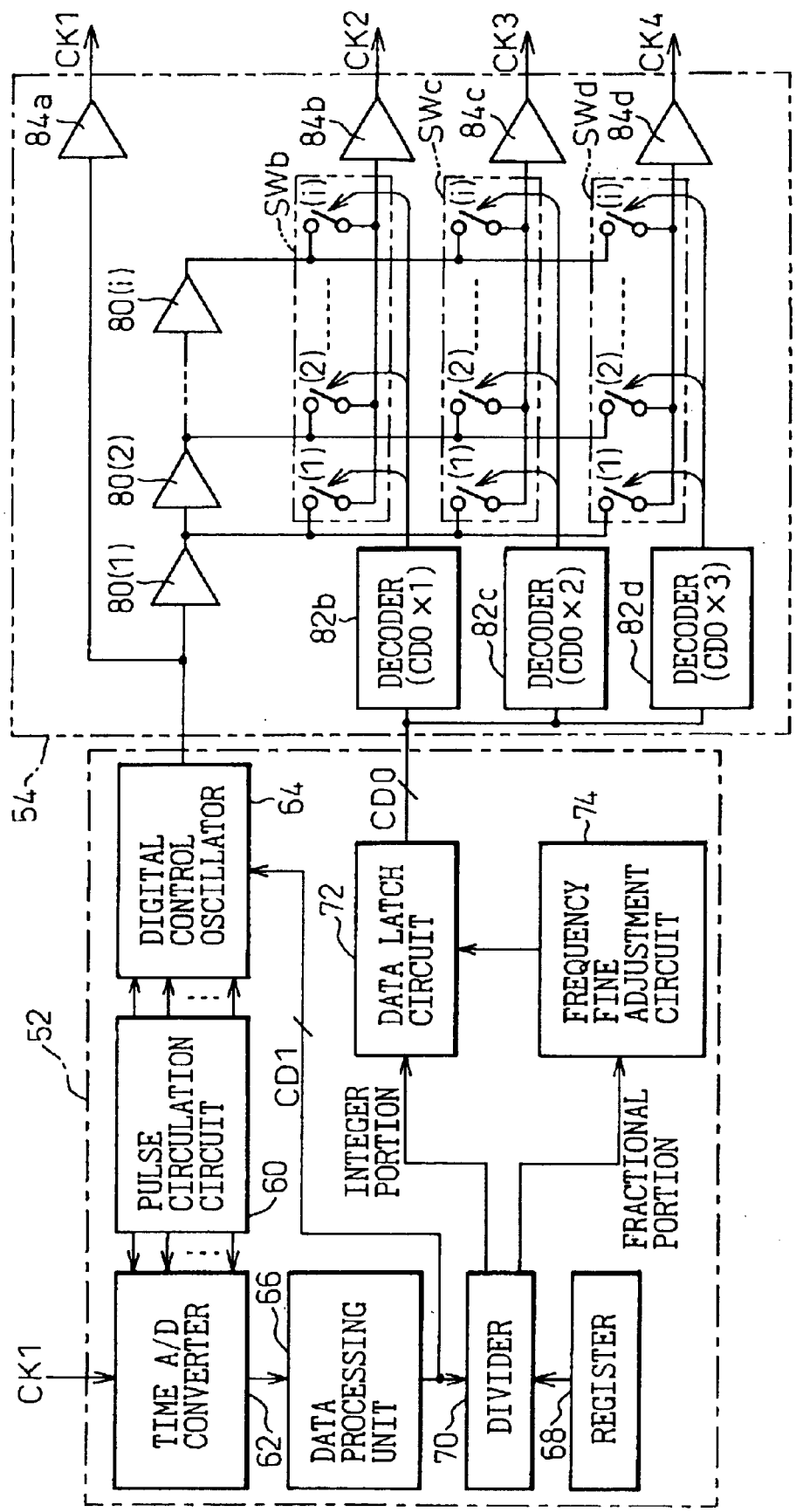
FIG. 12 is an explanatory diagram concerning a case where a sampling clock generating circuit is realized with a digital phase-locked loop (PLL)

The sampling clock generating circuit 50 shown in FIG. 12 comprises: a digital phase-locked loop (PLL) 52 that numerically expresses the period of an externally applied sampling clock CK1 and regenerates a sampling clock CK1 that locks onto and tracks the externally applied sampling clock; and a shift clock generating unit 54 that uses the sampling clock CK1 regenerated by the digital PLL 52 to produce the other sampling clocks CK2 and CK4.

In the shift clock generation unit 54, the sampling clock CK1 sent from the digital PLL is applied to a delay line. k delay units SW(1) to SW(k) constituting the delay line are used to sequentially delay the sampling clock CK1.

Switches SW(1) to SW(k) belonging to three groups of switches SWb to SWd are connected to the output nodes of respective delay units 80(1) to 80(*k*) in order to fetch clocks CK2 to CK4 that are out of phase with the sampling clock CK1.

Decoders 82*b* to 82*d* serving as pieces of switch selecting means (twenty-fourth embodiment) are connected to the respective groups of switches SWb, SWc, and SWd for fetching the respective clocks.

The decoders 82*b* to 82*d* designate the switch SW, from which an associated one of the clocks CK2 to CK4 is fetched, from the k switches SW(1) to SW(k) belonging to each of the groups of switches SWb to SWd. The decoders 82*b* to 82*d* then transmit a driving signal, with which the designated switch is turned on, to the respective groups of switches SWb to SWd. Thus, one switch belonging to each of the groups of switches SWb to SWd is selectively turned on. The decoders 82*b* to 82*d* are used to fetch the three respective shift clocks (that is, sampling clocks) CK2 to CK4, which lag behind the sampling clock CK1 by x/4 (where x denotes, 1, 2, or 3) of the cycle of the sampling clock DK1, through the respective designated switches SW.

In other words, the decoders 82b to 82d receive numerical data CD0, which represents a phase difference by which the phase of the sampling clock CK1 should be shifted, from the digital PLL 52 that will be described later. Herein, a delay time to be given by the delay units 80(1) to 80(k) is regarded as a temporal resolution. The decoders 82b to 82d multiply the numerical data CD0 by a set value (1, 2, or 3) indicating a delay rate x at which the associated clocks CK2 to CK4 are delayed to lag behind the sampling clock CK1. Thus, the decoders 82b to 82d calculate the location of a switch SW from which an associated one of the clocks CK2 to CK4 is fetched, and turn on the switch.

Consequently, the three kinds of sampling clocks CK2 to CK4 that lag behind the reference sampling clock CK1 by a ¼ of the period of the sampling clock CK1 serving as a reference are transmitted together with the sampling clock CK1 from the respective groups of switches SWb to SWd via respective buffers 84a to 84d.

On the other hand, the digital PLL 52 comprises a pulse circulation circuit 60, a time A/D converter 62, a data processing unit 66, and a digital control oscillator 64. The pulse circulation circuit 60 has a plurality of delay units concatenated annularly. The time A/D converter 62 counts the number of delay units, through which a pulse signal has passed within the pulse circulation circuit 60, during one period of an externally applied sampling clock CK1, and thus numerically expresses the period of the sampling clock CK1. The data processing unit 66 processes numerical data generated by the time A/D converter 62 and transmits numerical data CD1 that expresses the period of a clock that should be generated by the digital PLL 52. The digital control oscillator 64 counts the number of delay units within the pulse circulation circuit 60, through which the pulse signal has passed, to generate a clock at intervals of the same cycle as the cycle expressed by the numerical data CD1.

In this example, the digital PLL 52 regenerates the sampling clock CK1. The data processing unit 66 therefore transmits numerical data sent from the time A/D converter 62 to the digital control oscillator 64 as it is. Based on the received numerical data CD1, the digital control oscillator 64 regenerates the sampling clock CK1. The regenerated sampling clock CK1 is transmitted to the shift clock generating unit 54.

Moreover, the numerical data CD1 sent from the data processing unit 66 is also applied to a divider 70. The divider 70 calculates a phase difference by which shift clocks to be generated by the shift clock generating unit 54 will be out of phase with one another. The divider 70 divides the numerical data CD1 by a divisor (in this example, 4) stored in a register 68. The quotient (an integral part of the quotient) is transmitted to a data latch circuit 72. The data latch circuit 72 transmits the quotient as numerical data CD0 for use in producing shift clocks to the shift clock production unit 54.

A decimal part of the quotient produced by the divider 70 is transmitted to a frequency fine adjustment circuit 74. The frequency fine adjustment circuit 74 adds 1 to control data, which is latched by the data latch circuit 72, at a rate corresponding to the decimal part, and thus corrects the numerical data CD0.

As mentioned above, the sampling clock generating circuit 50 shown in FIG. 12 uses the externally applied sampling clock CK1 to generate the four sampling clocks CK1 to CK4 including the sampling clock CK1.

The sampling clock generating circuit 50 uses the delay time to be given by the delay units to numerically express the period of the sampling clock CK1. Based on the resultant numerical data, a delay time by which the sampling clock CK1 is delayed is determined in order to produce the other sampling clocks CK2 to CK4. Even if the frequency of the sampling clock CK1 is high, the sampling clock generating circuit 50 operates without a problem.

In the above description, the sampling clock CK1 serving as a reference is applied externally. The digital PLL 52 regenerates the sampling clock CK1. For example, a reference clock CK0 representing the period for A/D conversion may be applied externally. Moreover, the sampling clock generating circuit 50 may have to generate a sampling clock whose period is m times longer than the period of the reference clock CK0. In this case, the data processing unit 66 included in the digital PLL 52 multiplies the numerical data sent from the time A/D converter 62 by m. In contrast, a low-frequency clock may be externally applied to the sampling clock generating circuit 50, and the sampling clock generating circuit 50 may have to generate a sampling clock whose period is a multiple of the period of the input clock CK0. In this case, the data processing unit 66 included in the digital PLL 52 divides the numerical data sent from the time A/D converter 62 by the multiplier.

As mentioned above, if a low-frequency clock is externally applied to the sampling clock generating circuit 50, the sampling clock generating circuit 50 may have to generate the sampling clocks CK1 to CKm that are multiples of the input clock CK0. If the frequencies of the sampling clocks CK1 to CKm that have to be generated are relatively low (several hundreds of kilohertz), the sampling clock generating circuit 50 may be configured as shown in FIG. 13.

Figure 13:
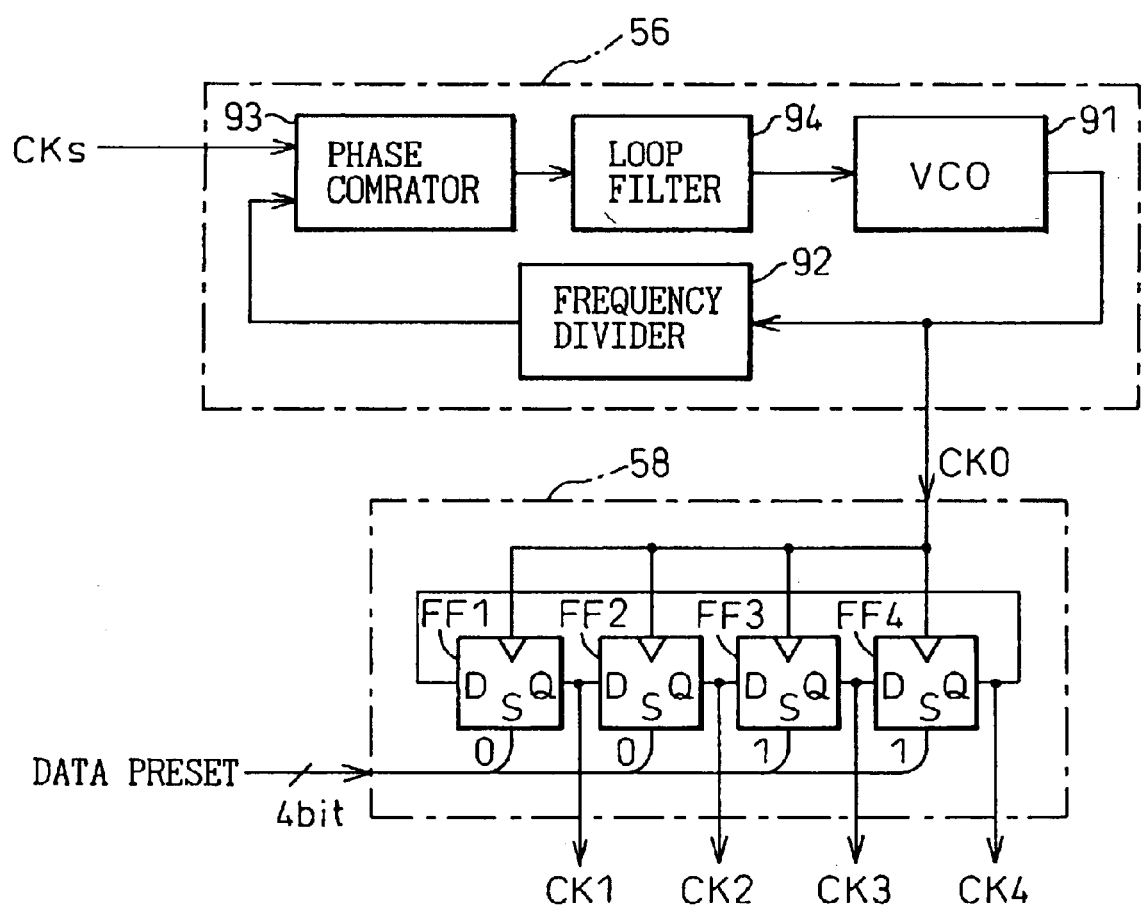
FIG. 13 is an explanatory diagram concerning a case where a sampling clock generating circuit is realized with an analog phase-locked loop (PLL)

The sampling clock generating circuit 50 shown in FIG. 13 comprises an analog PLL 56 and a shift register 58 which generate multiples of an externally applied clock CKs.

The analog PLL 56 comprises a voltage-controlled oscillator (VCO) 91, a frequency divider 92, a phase comparator 93, and a loop filter 94. The oscillation frequency of the VCO 91 can be controlled by voltage. The frequency divider 92 divides the frequency of an output of the VCO 91. The phase comparator 93 compares the phase of an output of the frequency divider 92 with the phase of an input clock CKs, and generates a control signal whose level is proportional to the phase difference. The loop filter 92 filters (integrates) the control signal sent from the phase comparator 93, and transmits the resultant signal as an oscillation frequency control voltage for the VCO 91. The oscillation frequency of the VCO 91 is therefore controlled to be set to a frequency calculated by multiplying the frequency of the input clock CKs by a predetermined multiplier determined with a divisor by which the frequency divider 92 divides the frequency of the output of the VCO 91.

On the other hand, the shift register 58 produces four shift clocks using a reference clock CK0 generated by the analog PLL 56, and transmits the shift clocks as the sampling clocks CK1 to CK4. The shift register 58 has the same configuration as the sampling clock generating circuit 50 shown in FIG. 10.

Even the sampling clock generating circuit 50 configured as shown in FIG. 13 can produce the desired sampling clocks CK1 to CK4 (CKm) on the basis of an externally applied input clock CKs.

FOURTH EXAMPLE

FIG. 14A is a block diagram showing the configuration of an A/D conversion device of a fourth example to which the present invention (more particularly, any of the first to fourth embodiments of the present invention and the eleventh to seventeenth embodiments thereof) is adapted.

As shown in FIG. 14A, the A/D conversion device of the present example comprises, similarly to the A/D conversion device of the first example shown in FIG. 1A, a pulse delay circuit 10, m (four in this example) pulse position numerizing units 12, and an adder 14. The adder 14 summates m (four in this example) numerical data items DT1 to DTm (DTm=DT4) generated by the respective pulse position numerizing units 12 so as to generate numerical data DTA of n+log$_2$m bits long.

Figure 14B:
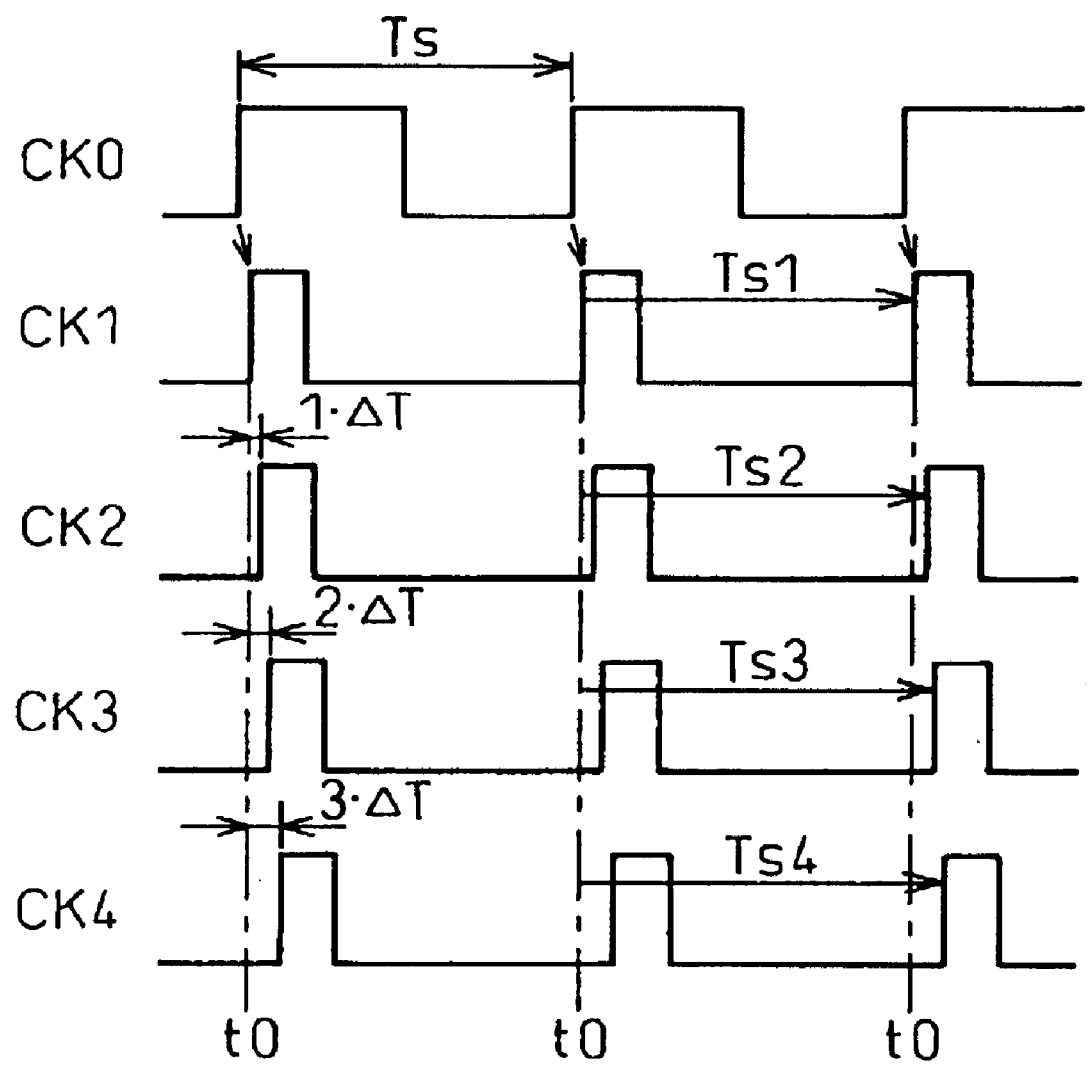
Figure 15:
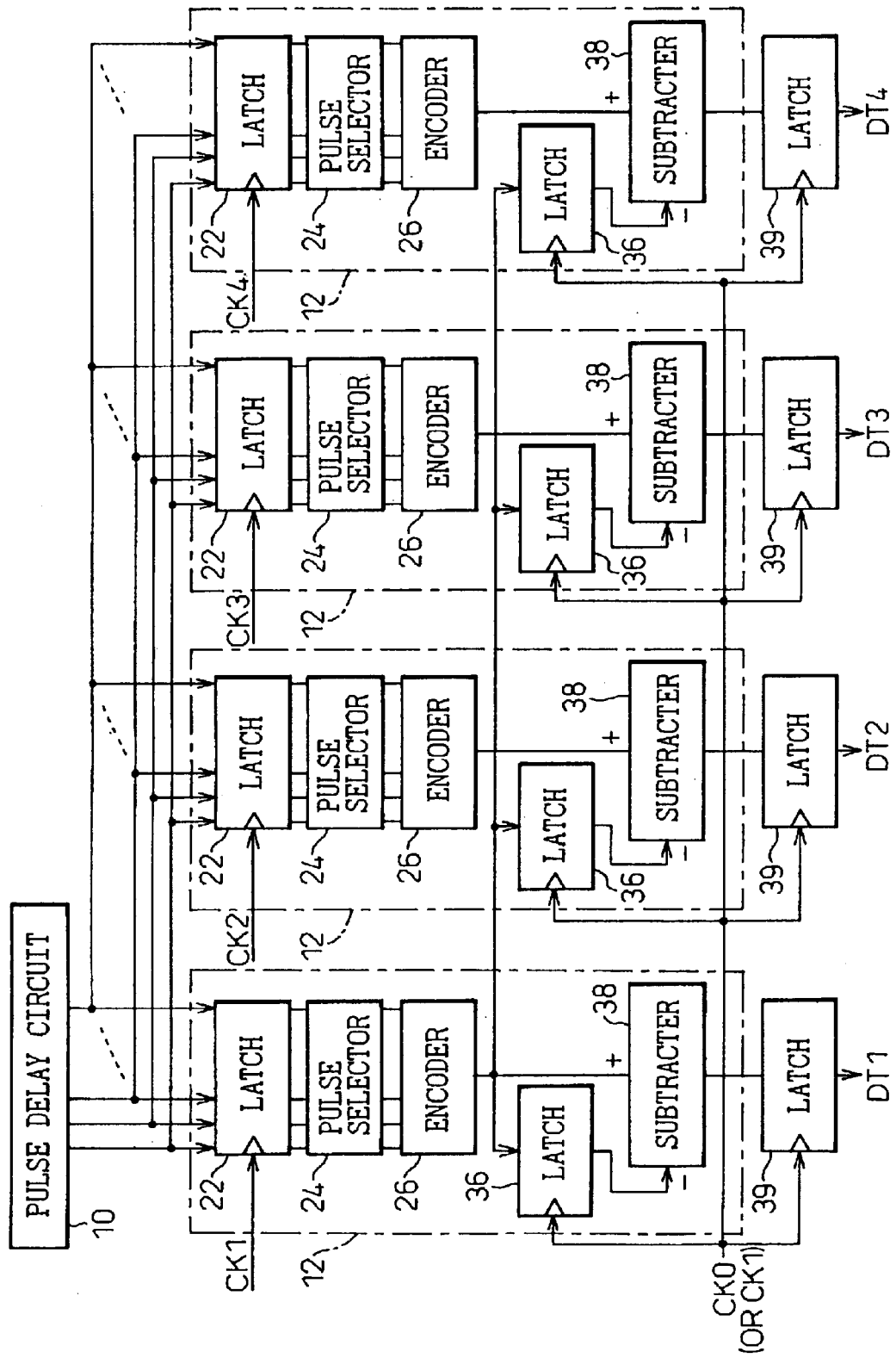
FIG. 15 is a block diagram showing the configurations of the pulse position numerizing units included in the fourth example.

A difference of the A/D conversion device of the present example from the A/D conversion device of the first example lies in that the four pulse position numerizing units 12 are configured as shown in FIG. 15. Another difference lies in that a reference clock CK0 having a certain cycle (Ts) as shown in FIG. 14B and one of four sampling clocks CK1 to CK4 produced based on the reference clock CK0 are applied to the pulse position numerizing units 12.

Only the differences of the present example from the first example will be described below.

As shown in FIG. 14B, the four sampling clocks CK1 to CK4 to be applied to the four pulse position numerizing units 12 respectively are produced by delaying the reference clock CK0. The sampling clocks CK1 to CK4 are out of phase with one another by a unit time ΔT. The unit time ΔT is calculated by dividing a delay time Td, which is given by delay units 2 constituting the pulse delay circuit 10, by the number of sampling clocks CK1 to CK4 (that is, 4). In other words, the sampling clocks CK2 to CK4 lag behind the sampling clock CK1 by an integral multiple of the unit time ΔT (1×ΔTs, 2×ΔTs, or 3×ΔTs).

As shown in FIG. 15, each of the four pulse position numerizing units 12 comprises, like the one included in the first example shown in FIG. 1B, a latch 22, a pulse selector 24, an encoder 26, a latch 36, and a subtractor 38. The sampling clocks CK1 to CK4 that are out of phase with one another by the unit time ΔT are applied to the latches 22 included in the respective pulse position numerizing units 12. The reference clock CK0 (or the sampling clock CK1 included in the four sampling clock CK1 to CK4 and used as a reference) used to produce the four sampling clocks CK1 to CK4 is applied to the latches 36.

The latch 36 included in each of the pulse position numerizing units 2 latches a result of numerical expression (an output of the encoder 26) performed by the pulse position numerizing unit 12 (equivalent to the specific numerizing means included in the thirty-fifth embodiment). The pulse position numerizing units 12 use the sampling clock CK1 to numerically express a position within the pulse delay circuit 10 which a pulse signal PA reaches.

Consequently, the pulse position numerizing units 12 regard, as shown in FIG. 14B, the rising (or falling) edge of the sampling clock CK1 as a common start timing t0 for starting numerical expression. The pulse position numerizing units 12 numerically express the number of delay units 2, through which the pulse signal PA has passed within the pulse delay circuit 10, during respective sampling periods from the common start timing t0 to the next rising (or falling) edges of the sampling clocks CK1 to CK4 (period Ts, Ts+ΔT, Ts+2ΔT, or Ts+3ΔT). The results of the numerical expression DT1 to DT4 are then applied to the adder 14.

In the A/D conversion devices of the first to third examples, the sampling time during which the pulse position numerizing units 12 acquire a sample is set to a fixed value.

Figure 16A:
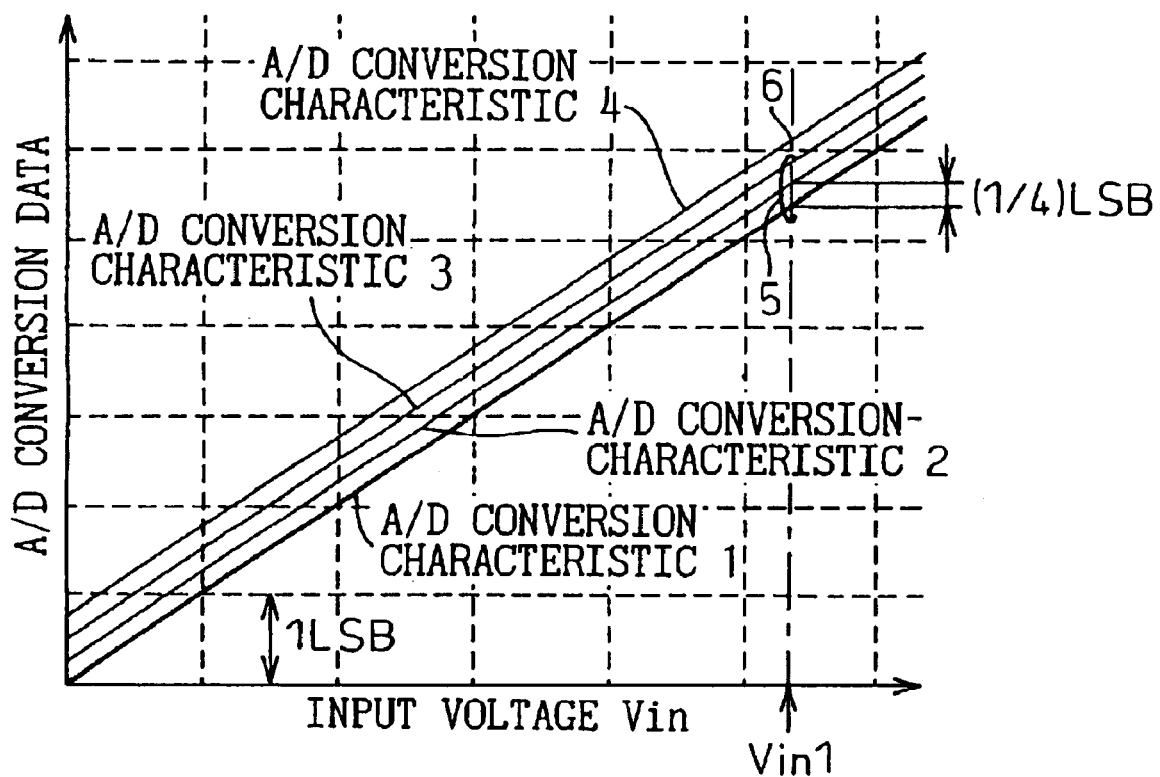
FIG. 16A and FIG. 16B are explanatory diagrams concerning the A/D conversion characteristics of the pulse position numerizing units included in the first and fourth examples.
Figure 16B:
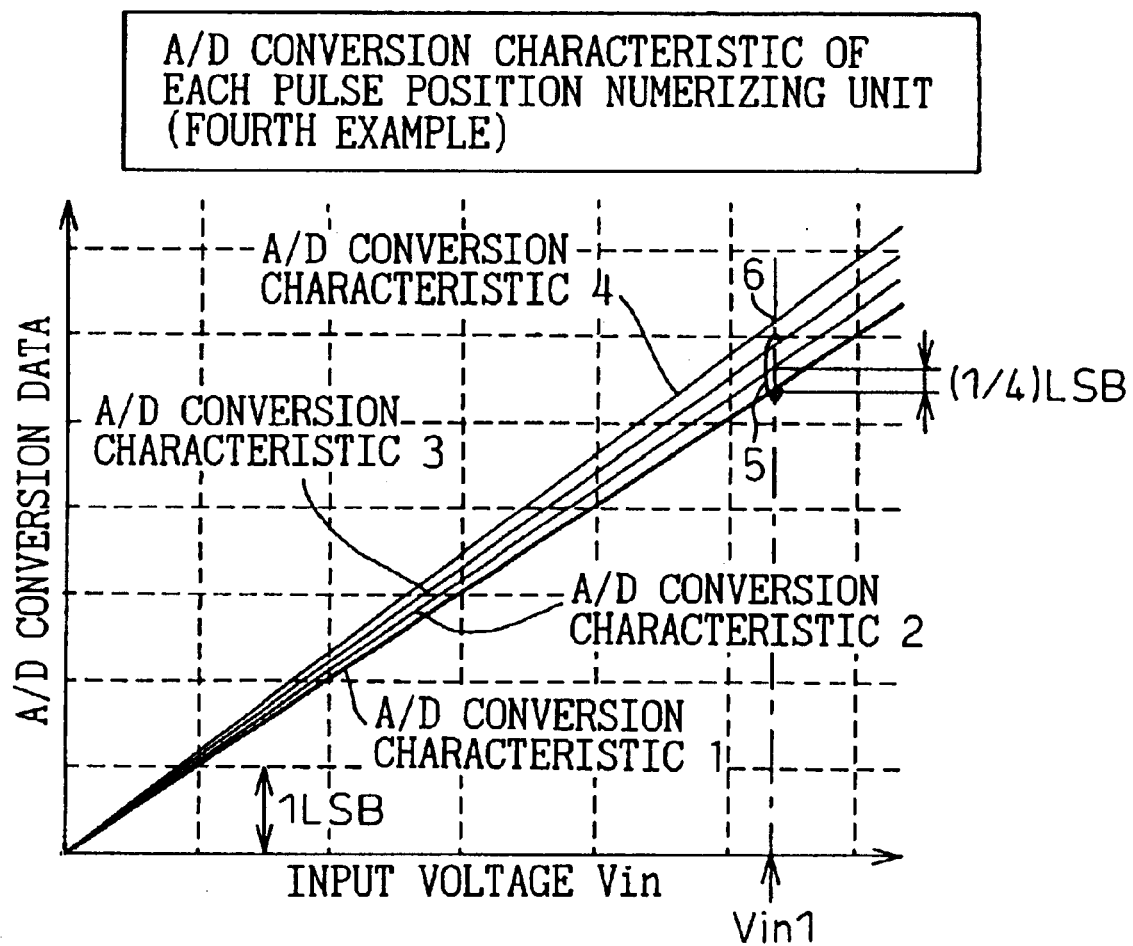

The timings that the respective pulse position numerizing units 12 start numerical expression are differentiated from one another by a time calculated by dividing the sampling time by the number m of pulse position numerizing units 12. Consequently, the A/D conversion characteristics of the respective pulse position numerizing units 12 are, as shown in FIG. 16A, plotted as straight lines drawn by offsetting a straight line indicating a reference A/D conversion characteristic by a 1/m of a voltage level representing a least-significant bit. The resolutions expressed by the numerical data items generated by the respective pulse position numerizing units 12 are the same as one another. However, in the A/D conversion device of the present example, the sampling times during which the respective pulse position numerizing units 12 acquire a sample are differentiated from one another by a 1/m of the delay time Td to be given by the delay units 2 constituting the pulse delay circuit 10. Consequently, the A/D conversion characteristics of the respective pulse position numerizing units 12 are, as shown in FIG. 16B, plotted as straight lines whose slopes are determined by changing the slope of the straight line indicating the reference A/D conversion characteristic (that is, sensitivity to A/D conversion). Eventually, the resolutions expressed by the numerical data items generated by the respective pulse position numerizing units 12 are set to values different from one another by a 1/m of the voltage level representing the least-significant bit.

According to the A/D conversion device of the present example, when a varying analog input signal Vin is A/D-converted, the same result of A/D conversion as the one provided by the A/D conversion device of the first example is, as shown in FIG. 16A and FIG. 16B, provided (6+5×3=21 in the figures). When the voltage level of the analog input signal Vin remains constant, numerical data items generated by the respective m pulse position numerizing units 12 included in the A/D conversion device of the first example have the same value. In contrast, in the A/D conversion device of the present example, the numerical data items generated by the respective pulse position numerizing units 12 have different values because of a difference in sensitivity among the pulse position numerizing units 12 (in other words, a difference in a resolution among them). Eventually, the analog input signal Vin can be A/D-converted with higher precision.

In the present example, the m (four) pulse position numerizing units 12 are equivalent to the plurality of A/D conversion circuits included in the A/D conversion device of the twenty-sixth embodiment, or the m pieces of pulse position numerizing means included in the A/D conversion device of any of the twenty-seventh to thirty-fifth embodiments. The adder 14 is equivalent to the adding means included in the A/D conversion device of any of the twenty-sixth to thirty-fifth embodiments.

In the present example, the sampling clocks CK1 to CK4 applied to the respective pulse position numerizing units 12 lag behind the reference clock CK0 and are out of phase with one another by a ¼ of the delay time Td to be given by the delay units 2 constituting the pulse delay circuit 10. A sampling clock generating circuit for use in generating the sampling clocks CK1 to CK4 may be, for example, configured as shown in FIG. 17A and FIG. 17B.

Figure 17A:
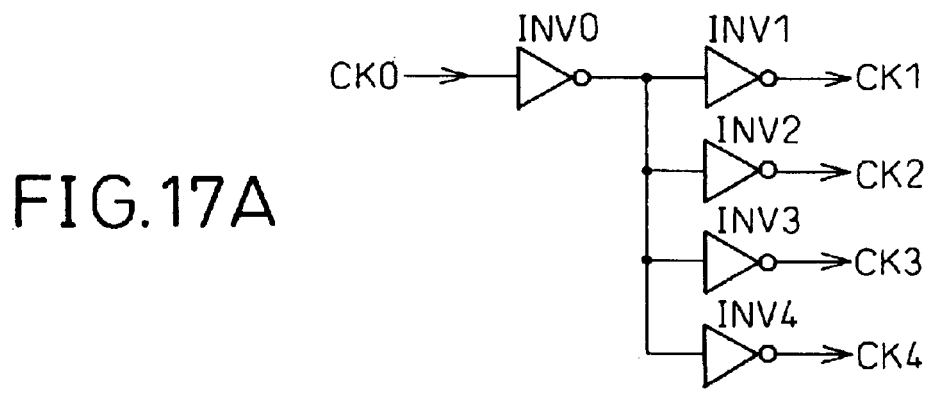
FIG. 17A and FIG. 17B are explanatory diagrams showing examples of a sampling clock generating circuit included in the A/D conversion device of the fourth example.
Figure 17B:
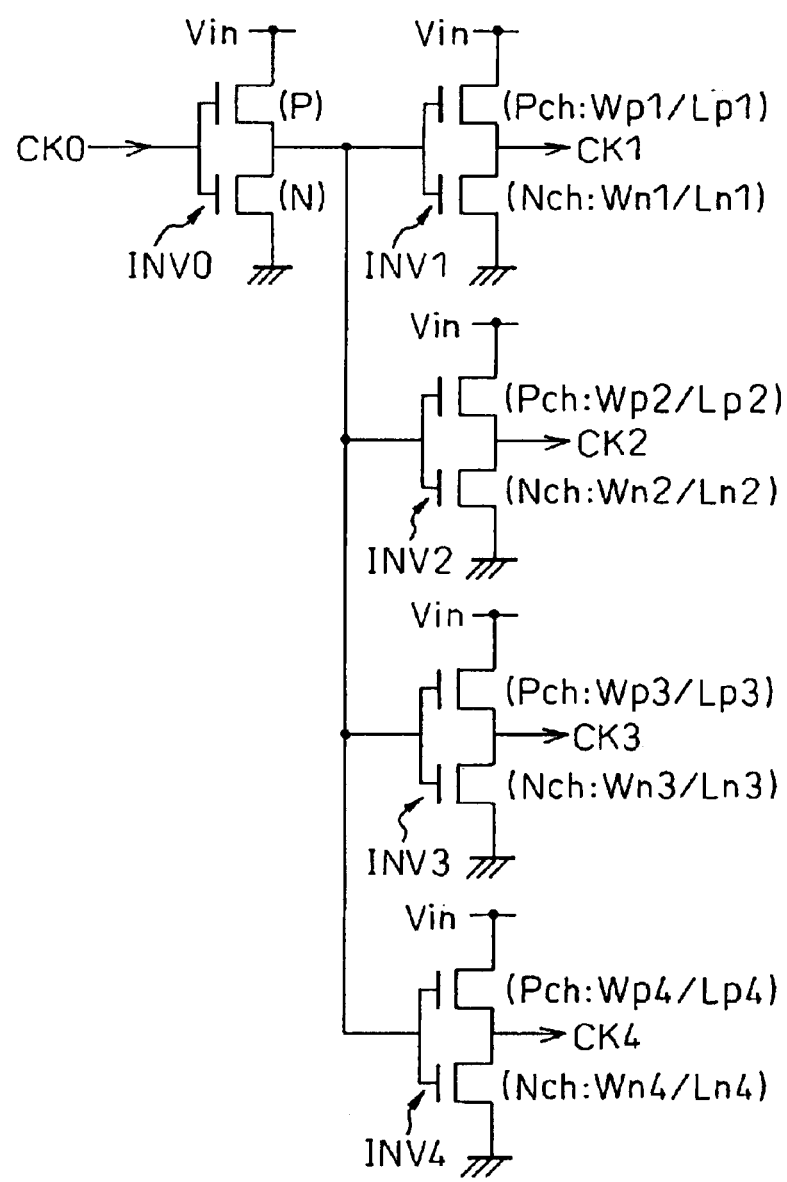

The sampling clock generating circuit shown in FIG. 17A and FIG. 17B is adopted in a case where each of the delay units 2 constituting the pulse delay circuit 10 is, as shown in FIG. 3A, composed of two stages of CMOS inverters INV. Each of the CMOS inverters INV includes a p-channel (field-effect) transistor and an n-channel (field-effect) transistor. In the sampling clock generating circuit, an inverter INV0 of a first stage and inverters INV1 to INV4 of a second stage are used to generate four kinds of sampling clocks CK1 to CK4 that lag behind the reference clock CK0. The inverters INV1 to INV4 are equivalent to the inverters realizing m delay units included in the thirtieth to thirty-third embodiments.

The inverters INV1 to INV4 of the second stage generate the sampling clocks CK1 to CK4 respectively. In order to make the sampling clocks CK1 to CK4 out of phase with one another by a Td/4, the lengths Lp and Ln of the gates of the p-channel (field-effect) transistor and n-channel (field-effect) transistor constituting each of the inverters INV1 to INV4 or the widths Wp and Wn of the transistors are adjusted. Consequently, as shown in FIG. 18, a transition time Tf during which the levels of outputs of the respective inverters INV1 to INV4 make a transition along with a change in the level of an input signal is set to be nearly equal to the delay time Td to be given by the delay units 2. Moreover, an inversion level that is a level of the input signal at which each of the inverters inverts the output level is set to a voltage level (any of inversion levels 1 to 4) that is a m+1 (5 in this example) submultiple of a change in the level of an output of the inverter INV0 (a deviation of a high level from a low level).

The inversion levels at which the inverters INV1 to INV4 invert the respective output levels and the transition time during which the output levels make a transition can be determined arbitrarily according to the structure of transistors constituting each of the inverters INV1 to INV4. In the present example, for example, the length Lp of the gate of the p-channel (field-effect) transistor, the length Ln of the gate of the n-channel (field-effect) transistor, and the width of the n-channel transistor are fixed. The width Wp of the p-channel transistor is determined for each of the inverters INV1 to INV4 so that the lengths Wp1, Wp2, Wp3, and Wp4 of the gates of the respective p-channel transistors included in the inverters INV1 to INV4 respectively will have a relationship of Wp1>Wp2>Wp3>Wp4. Consequently, the inversion level at which the inverter INV1 inverts the output level is the highest, while the inversion level at which the inverter INV4 inverts the output level is the lowest. Moreover, the transition time Tf during which the output levels of the respective inverters INV1 to INV4 make a transition is nearly equal to the delay time Td to be given by the delay units 2.

Moreover, the delay time Td to be given by the delay units 2 constituting the pulse delay circuit 10 varies depending on the analog input signal Vin. The inversion levels at which the respective inverters INV1 to INV4 invert the respective output levels and the transition time during which the output levels make a transition must also vary along with the variation of the delay time Td. Therefore, the analog input signal Vin (or a voltage having the same level as the analog input signal Vin and being produced from the analog input signal Vin) is used as a supply voltage to be applied to the sampling clock generating circuit shown in FIG. 17.

The thus configured sampling clock generating circuit is used to produce the sampling clocks CK1 to CK4 to be applied to the respective pulse position numerizing units 12 included in the present example. Consequently, a phase difference by which the sampling clocks CK1 to CK4 are out of phase with one another can be accurately set to a 1/m of the delay time Td to be given by the delay units 2. The sensitivities for A/D conversion (eventually a resolution) offered by the respective pulse position numerizing units 12 can be set to desired levels determined with desired characteristics. Eventually, precision in numerical data produced by the adder 14 can be improved.

Figure 19:
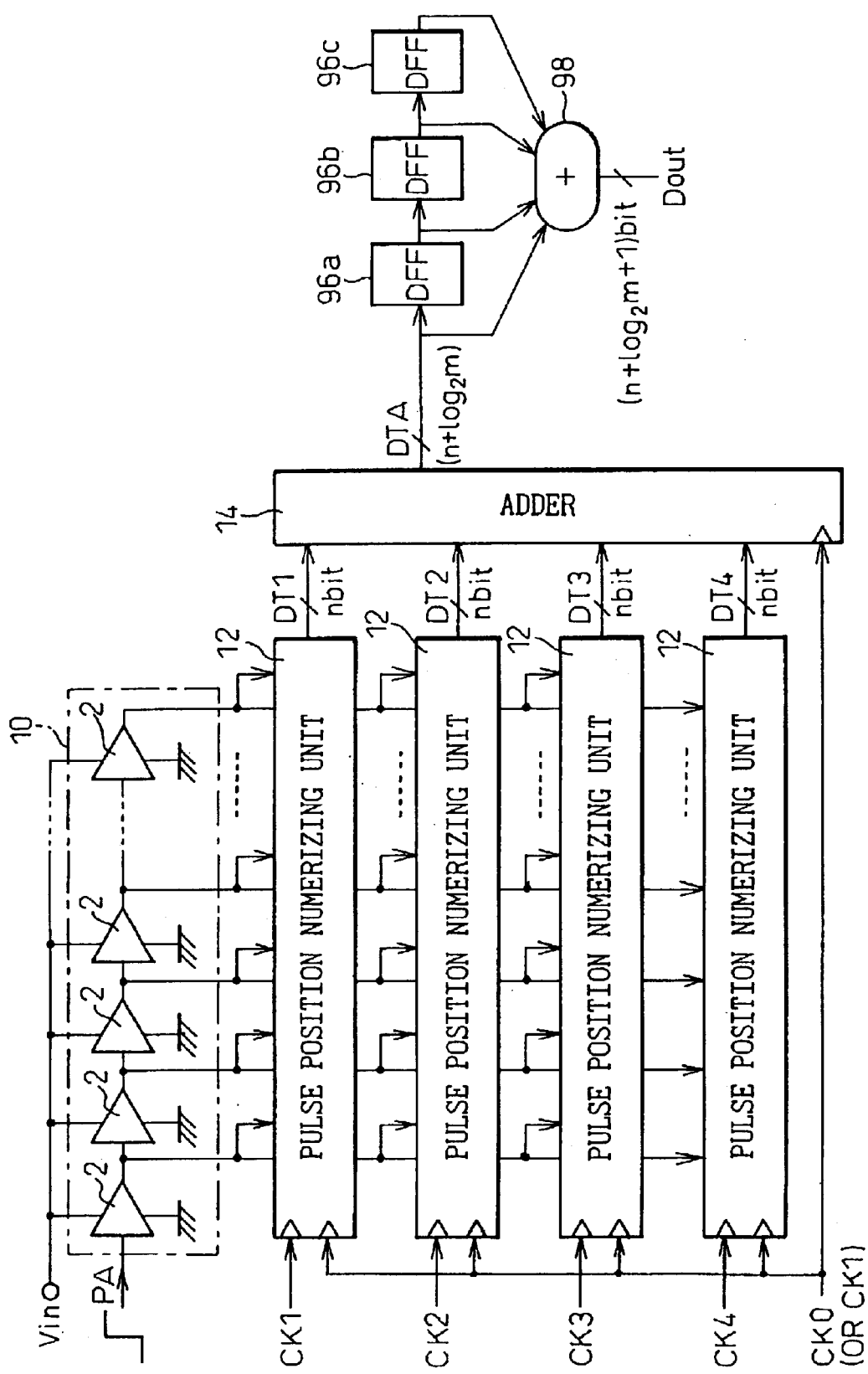
FIG. 19 is a block diagram showing the configuration of an A/D conversion device having, in addition to the same components as the A/D conversion device of the fourth example, a circuit for calculating a moving average of a result of A/D conversion.

On the other hand, in order to improve a signal-to-noise ratio relative to a result of A/D conversion performed by the A/D conversion device of the present example, a configuration shown in FIG. 19 may be adopted. Specifically, latches 96a, 96b, and 96c realized with D flip-flops latch numerical data DTA resulting from summation performed by the adder 14 while successively shifting it. An addition circuit 98 summates three past numerical data items DTA latched by the latches 96a, 96b, and 96c and the newest one of numerical data DTA produced by the adder 14. A moving average may thus be calculated for the numerical data DTA. Referring to FIG. 19, the addition circuit 98 is designed so that numerical data Dout that is the moving average produced by the addition circuit 98 will be n+log2m+1 bits long. The number of n+log2m+1 bits is one bit larger than the number of bits constituting the numerical data DTA produced by the adder 14.

Examples of the present invention have been described above. As is apparent from the examples, an A/D conversion device in which the present invention is implemented can be realized with a digital circuit alone. Numerical data produced by the A/D conversion device does not change time-sequentially but is highly reliably and unsusceptible to an environment. As long as the present invention is implemented in an A/D conversion device, the A/D conversion device can be used even in an environment in which any other type of A/D conversion device can hardly be used. For example, the A/D conversion device in which the present invention is implemented will prove very useful when adapted to any of automobile electronics expected to be used in severe use environments.

By the way, the idea that numerical data items produced by a plurality of A/D conversion circuits (pulse position numerizing units 12) offering different resolutions are summated in order to improve precision in A/D conversion is implemented in the fourth example. The idea can be adapted not only to a digital circuit that performs A/D conversion using the pulse delay circuit 10 and pulse position numerizing units 12 but also to an already known analog A/D conversion device.

In the fourth example, the pulse delay circuit 10 has been described to have numerous delay units 2 simply concatenated in tandem. Similarly to the second example, the pulse circulation circuit 20 may be adopted as the pulse delay circuit 10. Moreover, the pulse position numerizing units 12 may fetch an output of the circulation-number counter 16, which counts the number of times by which a pulsating signal has circulated through the pulse circulation circuit 20, as high-order bit data.

What is claimed is:

1. An analog-to-digital conversion method for converting an analog input signal into numerical data using at least one pulse delay circuit that has a plurality of delay units, which delay and transmit a pulse signal, connected in series with one another, comprising the steps of:

changing a delay time, which is given by said delay units constituting said pulse delay circuit, according to the analog input signal;

applying a pulse signal to said pulse delay circuit and transferring the pulse signal within said pulse delay circuit; and numerically expressing a position of the pulse signal within said pulse delay circuit at a plurality of different timings, summating results of the numerical expression, and thus producing the numerical data.

2. An A/D conversion method according to claim 1 wherein: the number of said at least one pulse delay circuit is one; and the position of the pulse signal within the one pulse delay circuit is numerically expressed at the different timings.

3. An A/D conversion method according to claim 1, wherein said analog input signal is used as a driving voltage with which said delay units constituting the pulse delay circuit are driven, and the delay time to be given by said delay units is changed based on the analog input signal.

4. An A/D conversion method according to claim 1, wherein said analog input signal is used to control a driving current that flows into said delay units, and the delay time to be given by said delay units is changed based on the analog input signal.

5. An A/D conversion method according to claim 1, wherein the position of the pulse signal within said pulse delay circuit is repeatedly numerically expressed synchronously with a plurality of sampling clocks that have the same cycle but are out of phase with one another, a number of delay units, through which the pulse signal has passed within said pulse delay circuit during one period of the sampling clocks, is calculated from a deviation of new data representing the numerically expressed position of the pulse signal from previous data representing it, and a plurality of numerical data items to be summated is generated from said number of delay units.

6. An A/D conversion method according to claim 5, wherein adjoining ones of the timings of numerical expression determined with respective sampling clocks are different from each other by a certain time.

7. An A/D conversion method according to claim 6, wherein timings of numerical expression determined with the respective sampling clocks are timings obtained by equally dividing one period of said respective sampling clock.

8. An A/D conversion method according to claim 5, wherein a time calculated by adding a maximum value of a phase difference between adjoining ones of the sampling clocks to the period of sampling clocks is equal to or shorter than the time from the instant the pulse signal was applied to said pulse delay circuit to the instant the pulse signal has passed through all the delay units included in said pulse delay circuit.

9. An A/D conversion method according to claim 5, wherein:
a pulse circulation circuit having delay units concatenated annularly and circulating the pulse signal through it is used as said pulse delay circuit;
a circulation-number counter is used to count a number of times by which the pulse signal has circulated through said pulse circulation circuit after being applied to said pulse circulation circuit;
the position of the pulse signal within said pulse circulation circuit is numerically expressed synchronously with the sampling clocks in order to generate numerical data that has, as a low-order bit data thereof, numerical data resulting from the numerical expression and, as a high-order bit data thereof, the number of times by which the pulse signal has circulated and which is counted by said circulation-number counter; and
the number of delay units through which the pulse signal has passed during one period of the sampling clocks is calculated from a deviation between a new generated numerical data and a previously generated numerical data.

10. An A/D conversion method according to claim 9, wherein the period of the sampling clocks is equal to or shorter than at least a time from an instant the pulse signal is applied to said pulse delay circuit to an instant said circulation-number counter overflows.

11. An A/D conversion method according to claim 1, wherein a plurality of numerical data items to be summated is generated by numerically expressing the position of the pulse signal, which varies within said pulse delay circuit, during sampling times that are different from one another by a predetermined unit time.

12. An A/D conversion method according to claim 11, wherein said unit time is a time (Td/m) calculated by dividing a delay time (Td), which is to be given by said delay units constituting said pulse delay circuit, by the number of sampling times (m), or a time calculated by adding an integral multiple of the delay time (Td), which is to be given by the delay units, to the time (Td/m).

13. An A/D conversion method according to claim 11, wherein the sampling times are determined using m sampling clocks that have the same period but are out of phase with one another by said unit time.

14. An A/D conversion method according to claim 13, wherein said m sampling clocks are generated by delaying a reference clock, which has a certain period, by integral multiples of the unit time.

15. An A/D conversion method according to claim 13, wherein: one of the m sampling times is set to a period from the rising or falling edge of a specific sampling clock that leads other sampling clocks by phase among the m sampling clocks to the next rising or falling edge thereof; and
the other sampling times are set to periods from the rising or falling edge of the specific sampling clock to the rising or falling edges of the other sampling clocks.

16. An A/D conversion method for converting an analog input signal into numerical data, wherein:
a plurality of A/D conversion circuits that offer different voltage resolutions which are expressed by respective numerical data items, that are results of A/D conversion, are used to commonly receive the analog input signal so as to respectively obtain an output data that numerically expresses the analog input signal; and
results of the numerical expression are summated in order to generate numerical data representing the analog input signal.

17. An A/D conversion method according to claim 16, wherein the voltage resolutions offered by said A/D conversion circuits are set to resolutions obtained by shifting a predetermined reference resolution in units of a unit resolution calculated by dividing a predetermined reference resolution by the number of A/D conversion circuits.

18. An analog-to-digital (A/D) conversion device for converting an analog input signal into numerical data, comprising:
a pulse delay circuit having a plurality of delay units, which delays a pulse signal by a delay time dependent on the voltage level of the analog input signal, connected in series with one another;
m pulse position numerizing means for detecting a position of the pulse signal within said pulse delay circuit at respective timings of the rising or falling edges of m sampling clocks, which are out of phase with one another, and numerically expressing the detected position of the pulse signal;
an adding means for summating numerical data items produced by said pulse position numerizing means, and producing a result of the summation as numerical data representing the analog input signal.

19. An A/D conversion device according to claim 18, wherein:
the m sampling clocks are clock signals that vary cyclically at intervals of the same period; and
said pulse position numerizing means repeatedly numerically express the position of the pulse signal within said pulse delay circuit at the respective timings of the rising or falling edges of associated sampling clocks, and generate numerical data which expresses a number of delay units through which the pulse signal has passed within said pulse delay circuit during one period of the sampling clocks, from a deviation of new data representing the numerically expressed position of the pulse signal from previous data representing it.

20. An A/D conversion device according to claim 19, wherein:
said pulse delay circuit is realized with a pulse circulation circuit that has said delay units concatenated annularly and that circulates the pulse signal through it;
a circulation-number counter is included for counting a number of times the pulse signal has circulated through said pulse circulation circuit;
each of said pulse position numerizing means includes:
a pulse position detecting circuit for numerically expressing the position of the pulse signal within said pulse circulation circuit at the timing of the rising or falling edge of an associated one of the sampling clocks; and
an arithmetic circuit for calculating a number of delay units, through which the pulse signal has passed within said pulse delay circuit during one cycle of the sampling clocks, from a deviation of a new one of numerical data, which has a low-order bit data thereof numerical data generated by said pulse position detecting circuit and as high-order bit data thereof numerical data generated by said circulation-number counter, from a previous one thereof.

21. An A/D conversion device according to claim 20, further comprising an input circuit for selectively applying a pulse signal, which is generated by a delay unit of a final stage in said pulse delay circuit, and a test clock for use in testing the counting action of said circulation-number counter.

22. An A/D conversion device according to claim 19, wherein:
a phase difference between an adjoining one of the m sampling clocks to be applied to the respective pulse position numerizing means is set to 1/m of one period of the sampling clocks;
said adding means fetches numerical data items sent from said respective pulse position numerizing means synchronously with the rising or falling edges of the m sampling clocks applied to said respective pulse position numerizing means, summates the m fetched numerical data items, and thus generates numerical data representing the analog input signal at intervals of a 1/m of one period of the sampling clocks.

23. An A/D conversion device according to claim 19, further comprising a sampling clock generating circuit that calculates a 1/m of a frequency of an externally applied reference clock and sequentially generates m shift clocks which have a phase difference corresponding one period of an externally applied reference clock and transmits the m shift clocks as the sampling clocks.

24. An A/D conversion device according to claim 23, further comprising a reference clock generating circuit for multiplying or dividing an externally applied input clock by a certain value so as to generate a reference clock having a desired frequency that corresponds to the frequency of the sampling clocks to be applied to said respective units of pulse position numerizing means, wherein:
the reference clock generated by said reference clock generating circuit is applied to said sampling clock generating circuit.

25. An A/D conversion device according to claim 19, further comprising a sampling clock generating circuit that includes:
a time A/D conversion means for numerically expressing the cycle of an externally applied reference clock;
a delay line including a plurality of stationary delay units that give a predetermined delay time for transmitting the externally applied reference clock while sequentially delaying it using said plurality of stationary delay units; and
m−1 groups of switches each having one contact thereof connected to an output node of said respective delay unit constituting said delay line and having the other contact thereof connected to the output path of a respective shift clock;
m−1 units of switch selecting means for multiplying numerical data, which is calculated by dividing numerical data produced by said time A/D conversion means by m, by respective integers ranging from 1 to m−1 so as to produce m−1 numerical data items, specifying the locations of switches, which should be selected and turned on and are included in the respective groups of switches, according to the produced numerical data items, selecting and turning on the switches at the specified locations, and then transmitting m−1 respective shift clocks, which successively lag behind the reference clock by a 1/m of the period of the reference clock, along the output paths extending from said respective groups of switches, wherein:
said sampling clock generating circuit transmits as m sampling clocks the reference clock and the m−1 shift clocks transmitted along the respective output paths extending from said respective groups of switches.

26. An A/D conversion device according to claim 18, wherein each of said delay units constituting said pulse delay circuit is realized with one stage of an inverter that inverts and transmits a pulse signal.

27. An A/D conversion device according to claim 18, wherein each of said delay units constituting said pulse delay circuit is realized with two stages of inverters, each of which inverts and transmits a pulse signal, connected in series with each other.

28. An A/D conversion device according to claim 18, wherein: said plurality of delay units constituting said pulse delay circuit is disposed along a straight line;
said m pulse position numerizing means for numerically expressing the position of a pulse signal within said pulse delay circuit are divided into two groups; and
pulse position numerizing means belonging to each group are arranged symmetrically to a straight line extending in the direction of disposition in which said delay units are disposed within said pulse delay circuit.

29. An A/D conversion device according to claim 18, further comprising:
an input signal selecting means for selecting as a signal, which is used to change a delay time to be given by said delay units, either the analog input signal or a reference signal whose voltage level is known, and applying the selected signal to said pulse delay circuit;

an uncorrected data holding means for when said input signal selecting means has the contacts thereof switched to apply the analog input signal to said pulse delay circuit, holding as uncorrected data numerical data produced by said adding means;

a reference data holding means for when said input signal selecting means has the contacts thereof switched to apply the reference signal to said pulse delay circuit, holding as reference data numerical data reduced by said adding means; and a dividing means for dividing the uncorrected data held in said uncorrected data holding means by the reference data held in said reference data holding means, and thus calculating corrected numerical data representing the analog input signal.

30. An A/D conversion device for converting an analog input signal into numerical data, comprising:

a plurality of A/D conversion circuits that offers different voltage resolutions which are expressed by respective numerical data items that are results of A/D conversion wherein the analog input signal is commonly received so as to be respectively converted to an output data that numerically expresses the analog input signal; and an adding means for summating results of numerical expression performed on the analog input signal by said plurality of A/D conversion circuits.

31. An A/D conversion device according to claim 30, further comprising a pulse delay circuit having a plurality of delay units, which delays a pulse signal by a delay time dependent on the voltage level of the analog input signal and transmits it, connected in series with one another, wherein:

said plurality of A/D conversion circuits are realized with m units of pulse position numerizing means that numerically express the position of a pulse signal, which varies within said pulse delay circuit, during respective sampling times that are different from one another by a predetermined unit time.

32. An A/D conversion device according to claim 31, wherein the unit time is a time (Td/m) calculated by dividing the delay time (Td) to be given by the delay units constituting said pulse delay circuit by the number of pieces of pulse position numerizing means (m), or a time calculated by adding an integral multiple of the delay time (Td) to be given by the delay units to the time (Td/m).

33. An A/D conversion device according to claim 31, further comprising a sampling clock generating circuit that generates m sampling clocks which have the same cycle but are out of phase with one another by the unit time and are input to said plurality of A/D conversion circuits, wherein:

said m pieces of pulse position numerizing means use m respective sampling clocks generated by said sampling clock generating circuit to numerically express the position of the pulse signal, which varies within said pulse delay circuit, during respective sampling times.

34. An A/D conversion device according to claim 33, wherein: said sampling clock generating circuit includes m delay units that give delay times which are different from one another by the unit time; and said sampling clock generating circuit uses the m delay units to delay a reference clock having a certain cycle and thus generates the m sampling clocks.

35. An A/D conversion device according to claim 34, wherein: said m delay units included in said sampling clock generating circuit are realized with inverters that invert the voltage level of an input signal at different inversion levels which correspond to voltage levels of a varying input signal, the inversion timings are different from one another along with a change in the signal level of the reference clock, and said inverters delay the reference clock by delay times that are different from one another by the unit time.

36. An A/D conversion device according to claim 35, wherein an output level transition time Tf of said inverters realizing each of said m delay units included in said sampling clock generating circuit make a transition that is nearly equal to the delay time Td to be given by one stage of a delay unit included in said pulse delay circuit.

37. An A/D conversion device according to claim 36, wherein said inverters realizing said m delay units included in said sampling clock generating circuit operate using the analog input signal as a supply voltage.

38. An A/D conversion device according to claim 33, wherein said pieces of pulse position numerizing means use a sampling clock, which leads among said m sampling clocks generated by said sampling clock generating circuit, as a common clock, and numerically express the position of the pulse signal, which varies within said pulse delay circuit, during respective sampling times from the rising or falling edge of the common clock to the rising or falling edges of the sampling clocks associated with said pieces of pulse position numerizing means.

39. An A/D conversion device according to claim 38, wherein: a specific one of said m pulse position numerizing means repeatedly and numerically expresses the position of the pulse signal within said pulse delay circuit at the rising or falling edge of the sampling clock serving as the common clock, and transmits a deviation of new data representing the numerically expressed position from previous data representing it as a result of numerical expression to said adding means; and pulse position numerizing means other than said specific numerizing means repeatedly numerically express the position of the pulse signal within said pulse delay circuit at the rising or falling edges of the respective sampling clocks associated with said pulse position numerizing means, and transmit as a result of numerical expression a deviation of data representing the numerically expressed position from previous data which said specific numerizing means has generated using the common clock.

40. An A/D conversion device according to claim 31, wherein each of said delay units constituting said pulse delay circuit is realized with one stage of an inverter that inverts and transmits a pulse signal.

41. An A/D conversion device according to claim 31, wherein each of said delay units constituting said pulse delay circuit is realized with two stages of inverters, each of which inverts and transmits a pulse signal, connected in series with each other.

42. An A/D conversion device according to claim 31, wherein: said plurality of delay units constituting said pulse delay circuit is disposed along a straight line;

said m pulse position numerizing means for numerically expressing the position of a pulse signal within said pulse delay circuit are divided into two groups;

pulse position numerizing means belonging to each group are arranged symmetrically to a straight line extending in the direction of disposition in which said delay units are disposed within said pulse delay circuit.

43. An A/D conversion device according to claim 31, further comprising:

an input signal selecting means for selecting as a signal, which is used to change a delay time to be given by said delay units, either the analog input signal or a reference signal whose voltage level is known, and applying the selected signal to said pulse delay circuit;

an uncorrected data holding means for when said input signal selecting means has the contacts thereof switched to apply the analog input signal to said pulse delay circuit, holding as uncorrected data numerical data produced by said adding means;

a reference data holding means for when said input signal selecting means has the contacts thereof switched to apply the reference signal to said pulse delay circuit, holding as reference data numerical data reduced by said adding means; and a dividing means for dividing the uncorrected data held in said uncorrected data holding means by the reference data held in said reference data holding means, and thus calculating corrected numerical data representing the analog input signal.

* * * * *